(12) United States Patent
Yamada et al.

(10) Patent No.: US 8,362,485 B2
(45) Date of Patent: Jan. 29, 2013

(54) INTEGRATED CIRCUIT DEVICE AND METHOD FOR MANUFACTURING INTEGRATED CIRCUIT DEVICE

(75) Inventors: Daiki Yamada, Isehara (JP); Yoshitaka Dozen, Isehara (JP); Eiji Sugiyama, Atsugi (JP); Hidekazu Takahashi, Isehara (JP)

(73) Assignee: Semiconductor Energy Laboratory Co., Ltd., Atsugi-shi, Kanagawa-ken (JP)

( * ) Notice: Subject to any disclaimer, the term of this patent is extended or adjusted under 35 U.S.C. 154(b) by 0 days.

(21) Appl. No.: 13/308,582

(22) Filed: Dec. 1, 2011

(65) Prior Publication Data

US 2012/0068181 A1    Mar. 22, 2012

Related U.S. Application Data

(62) Division of application No. 12/902,642, filed on Oct. 12, 2010, now Pat. No. 8,120,034, which is a division of application No. 12/342,446, filed on Dec. 23, 2008, now Pat. No. 7,816,685, which is a division of application No. 11/440,128, filed on May 25, 2006, now Pat. No. 7,485,511.

(30) Foreign Application Priority Data

Jun. 1, 2005   (JP) ................................. 2005-161413

(51) Int. Cl.
    *H01L 29/04*       (2006.01)
(52) U.S. Cl. .......................................... 257/59; 257/211
(58) Field of Classification Search ............... 257/59, 257/211
    See application file for complete search history.

(56) References Cited

U.S. PATENT DOCUMENTS

| | | | |
|---|---|---|---|
| 5,166,556 A | 11/1992 | Hsu et al. | |
| 5,581,385 A | 12/1996 | Spitzer et al. | |
| 5,757,456 A | 5/1998 | Yamazaki et al. | |
| 5,821,597 A | 10/1998 | Nakajima et al. | |
| 6,011,275 A | 1/2000 | Ohtani et al. | |
| 6,022,792 A | 2/2000 | Ishii et al. | |
| 6,118,502 A | 9/2000 | Yamazaki et al. | |
| 6,682,963 B2 | 1/2004 | Ishikawa | |
| 6,713,323 B2 | 3/2004 | Yamazaki et al. | |
| 6,720,576 B1 | 4/2004 | Nakajima et al. | |
| 6,814,832 B2 | 11/2004 | Utsunomiya | |
| 6,887,650 B2 | 5/2005 | Shimoda et al. | |
| 7,060,153 B2 | 6/2006 | Yamazaki et al. | |
| 7,109,071 B2 | 9/2006 | Ishikawa | |
| 7,151,044 B2 | 12/2006 | Kimura et al. | |
| 7,271,076 B2 | 9/2007 | Yamazaki et al. | |
| 7,364,954 B2 | 4/2008 | Kuwashima et al. | |
| 7,422,935 B2 | 9/2008 | Yamazaki | |
| 7,492,090 B2 | 2/2009 | Yamazaki et al. | |

(Continued)

FOREIGN PATENT DOCUMENTS

| | | |
|---|---|---|
| EP | 1130566 A | 9/2001 |
| EP | 1 193 759 | 4/2002 |

(Continued)

*Primary Examiner* — Douglas Menz
(74) *Attorney, Agent, or Firm* — Eric J. Robinson; Robinson Intellectual Property Law Office, P.C.

(57) ABSTRACT

An object of the present invention is to provide a structure of a thin film circuit portion and a method for manufacturing a thin film circuit portion by which an electrode for connecting to an external portion can be easily formed under a thin film circuit. A stacked body including a first insulating film, a thin film circuit formed over one surface of the first insulating film, a second insulating film formed over the thin film circuit, an electrode formed over the second insulating film, and a resin film formed over the electrode, is formed. A conductive film is formed adjacent to the other surface of the first insulating film of the stacked body to be overlapped with the electrode. The conductive film is irradiated with a laser.

20 Claims, 32 Drawing Sheets

U.S. PATENT DOCUMENTS

| | | |
|---|---|---|
| 7,518,692 B2 | 4/2009 | Yamazaki et al. |
| 7,612,753 B2 | 11/2009 | Koyama |
| 7,699,232 B2 | 4/2010 | Koyama et al. |
| 7,927,971 B2 | 4/2011 | Tamura et al. |
| 8,129,900 B2 | 3/2012 | Yamazaki et al. |
| 2001/0053559 A1 | 12/2001 | Nagao et al. |
| 2003/0071953 A1 | 4/2003 | Yamazaki et al. |
| 2005/0070038 A1 | 3/2005 | Yamazaki et al. |
| 2005/0174845 A1 | 8/2005 | Koyama et al. |
| 2008/0036680 A1 | 2/2008 | Ito et al. |
| 2008/0042168 A1 | 2/2008 | Watanabe et al. |
| 2010/0045584 A1 | 2/2010 | Koyama |
| 2011/0171778 A1 | 7/2011 | Tamura et al. |
| 2012/0129287 A1 | 5/2012 | Yamazaki et al. |

FOREIGN PATENT DOCUMENTS

| | | |
|---|---|---|
| EP | 1437683 A | 7/2004 |
| JP | 03-232232 A | 10/1991 |
| JP | 08-125120 A | 5/1996 |
| JP | 08-254686 | 10/1996 |
| JP | 2001-272923 | 10/2001 |
| JP | 2001-318624 A | 11/2001 |
| JP | 2001-345452 A | 12/2001 |
| JP | 2003-203898 | 7/2003 |
| JP | 2004-220591 A | 8/2004 |
| JP | 2004-349543 A | 12/2004 |
| JP | 2005-056985 A | 3/2005 |
| JP | 2005-116518 A | 4/2005 |
| WO | WO 2005/057658 | 6/2005 |

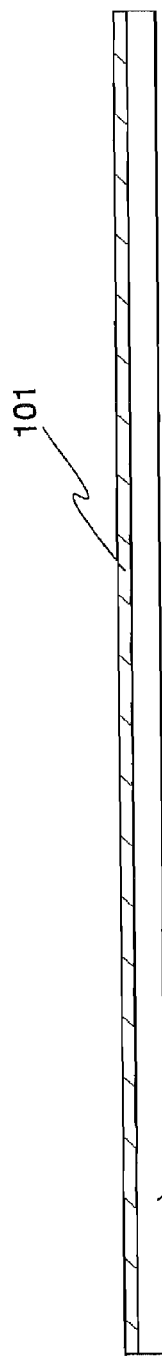
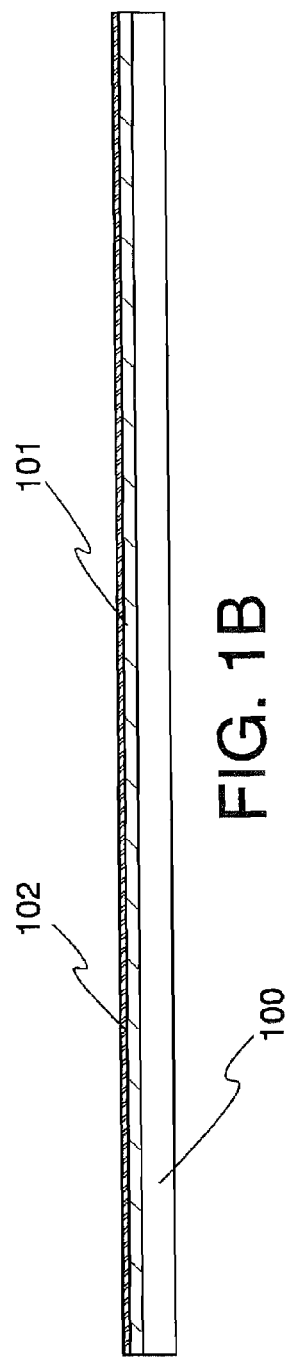
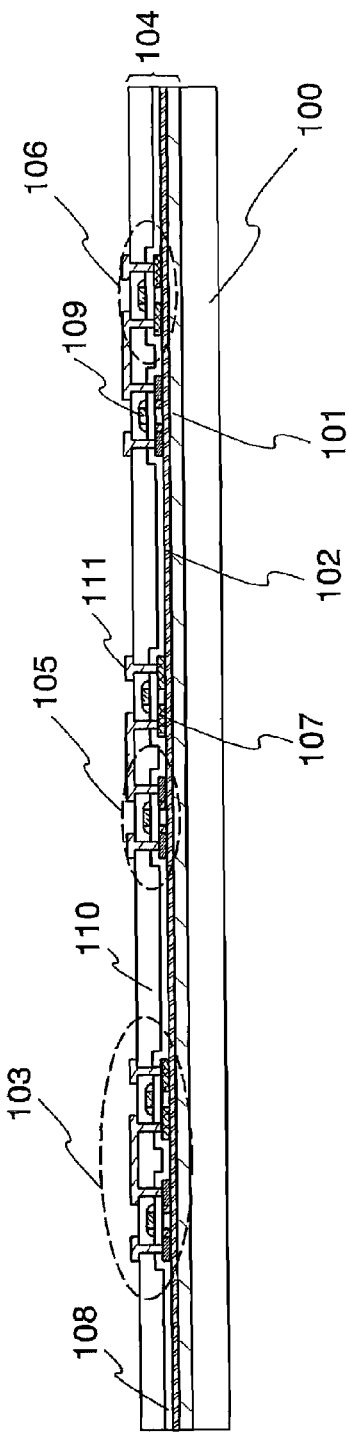

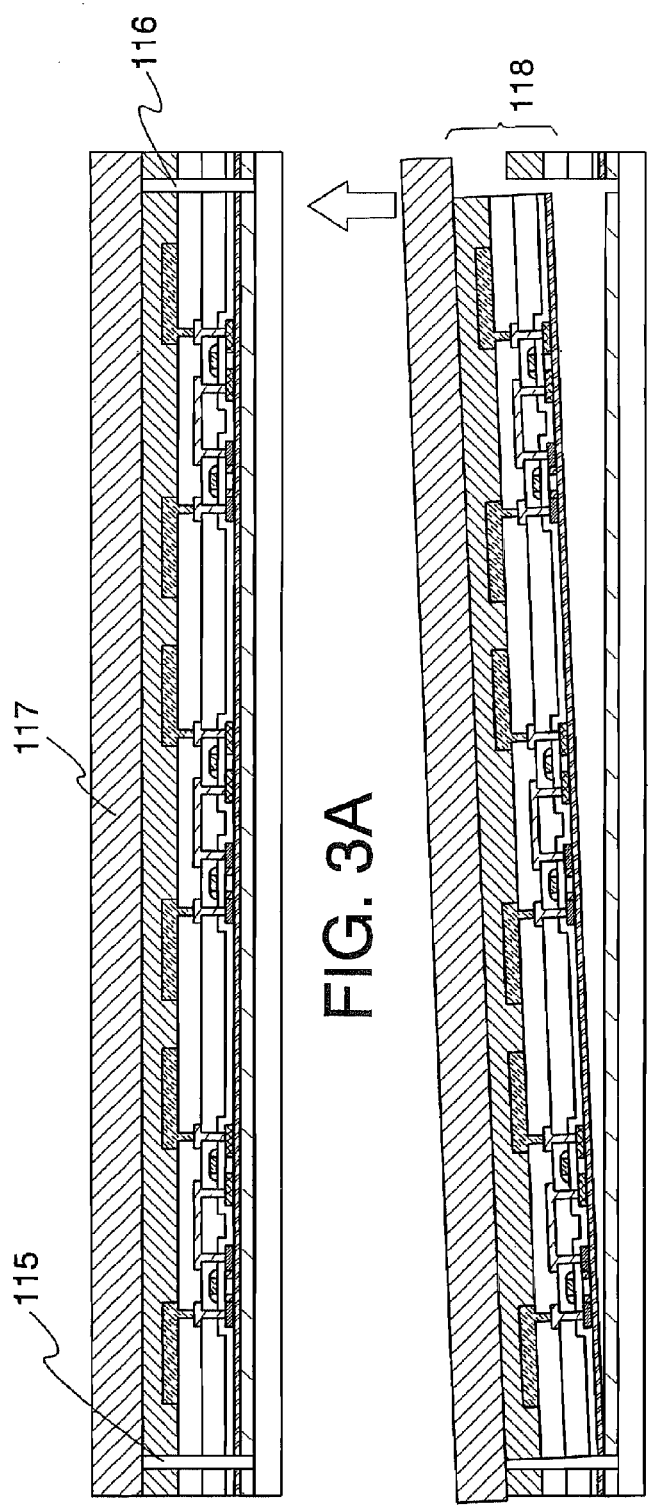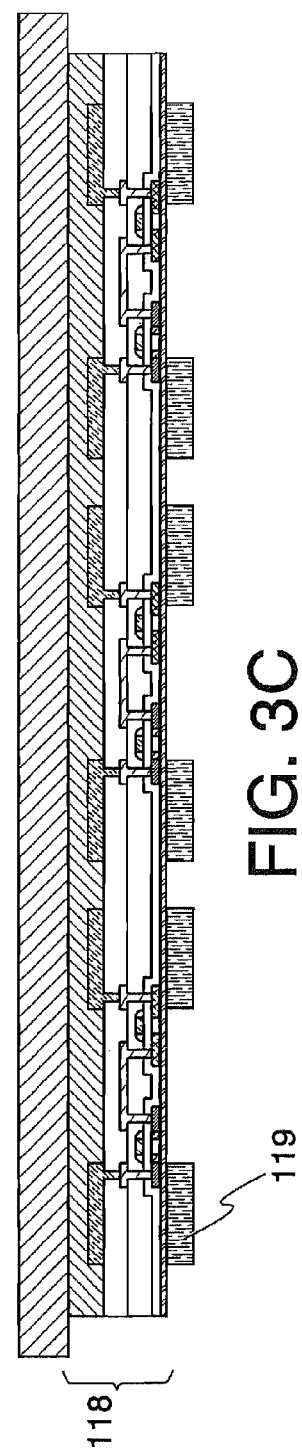
FIG. 3A
FIG. 3B
FIG. 3C laser light laser light

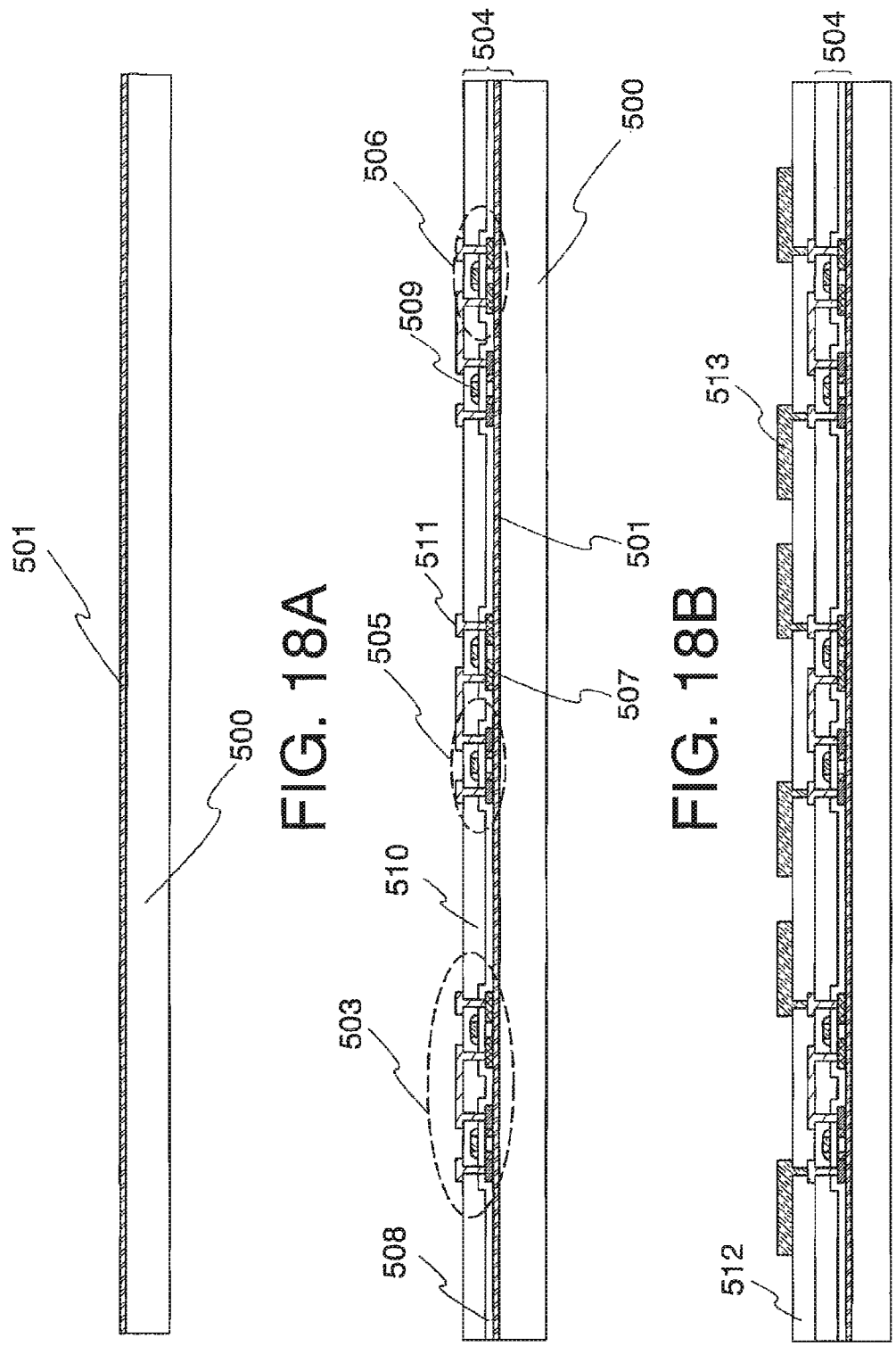

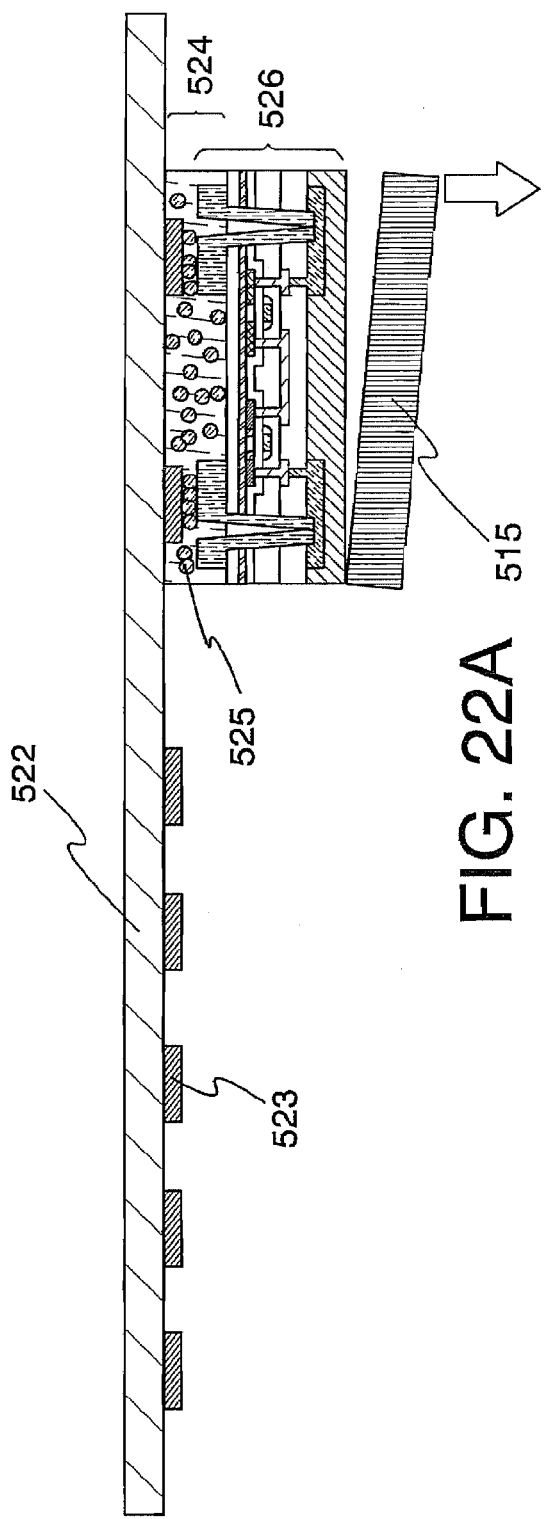
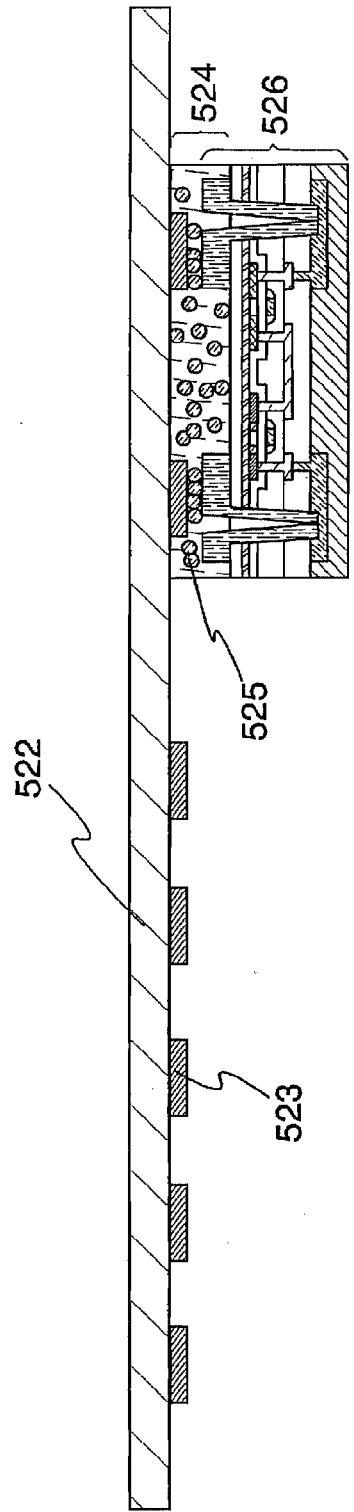
FIG. 22A
FIG. 22B

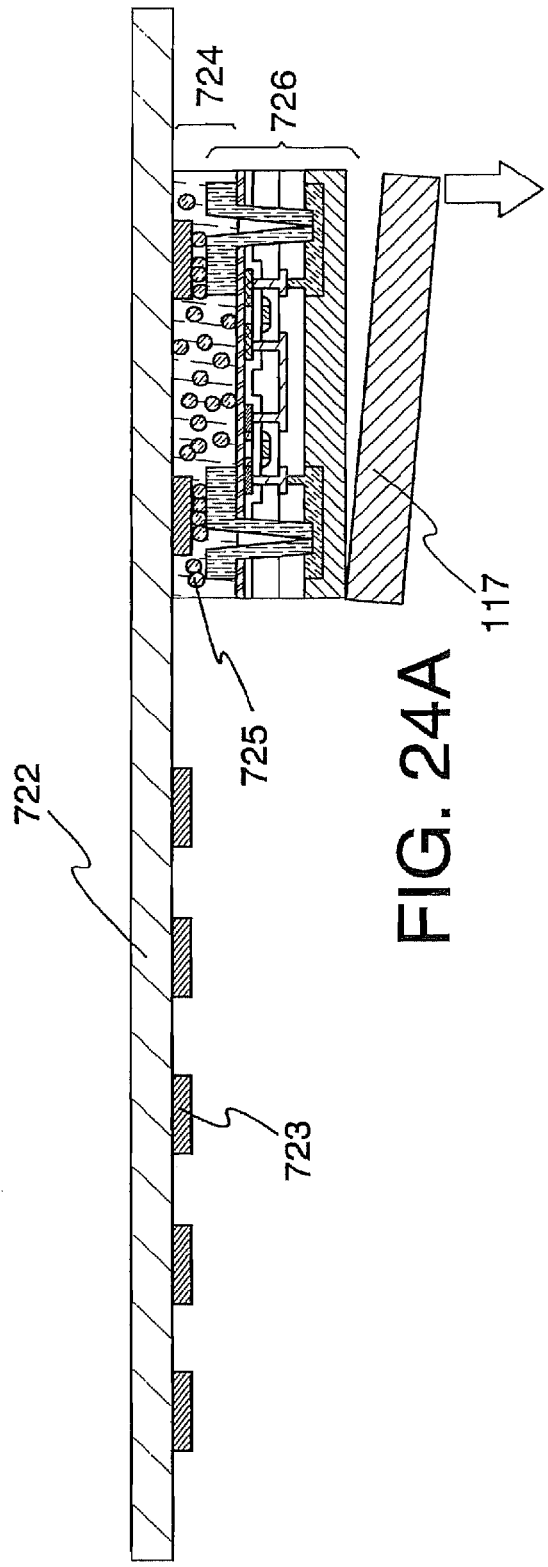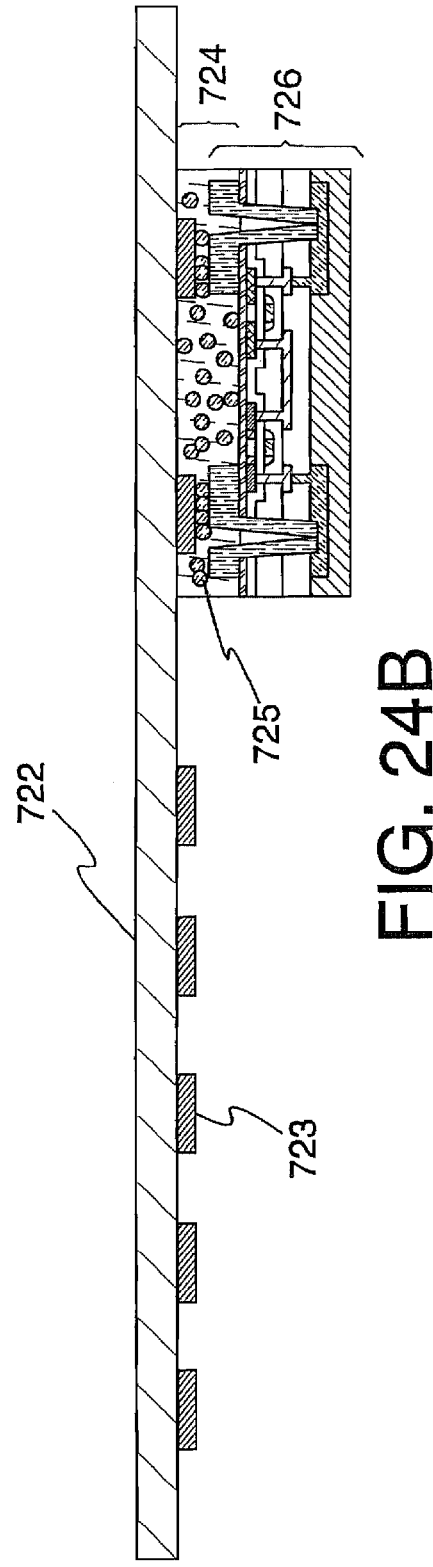

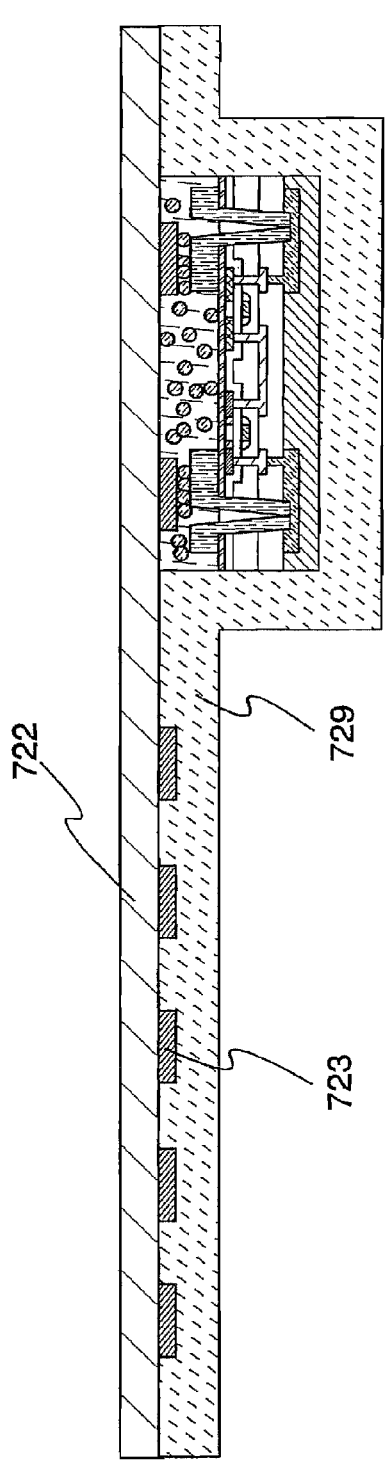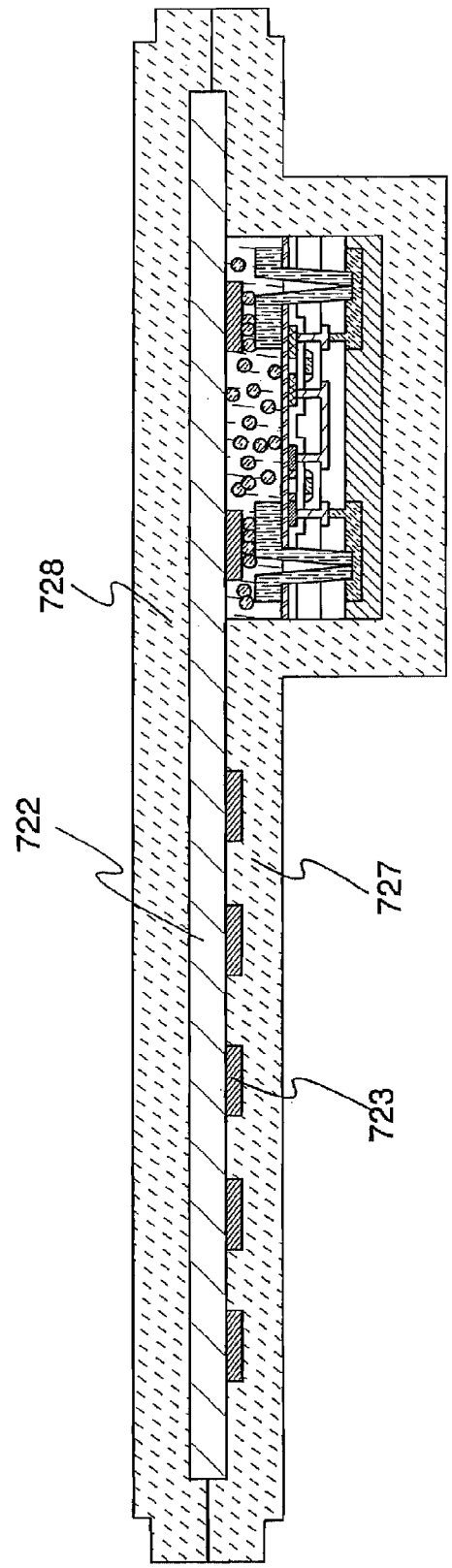

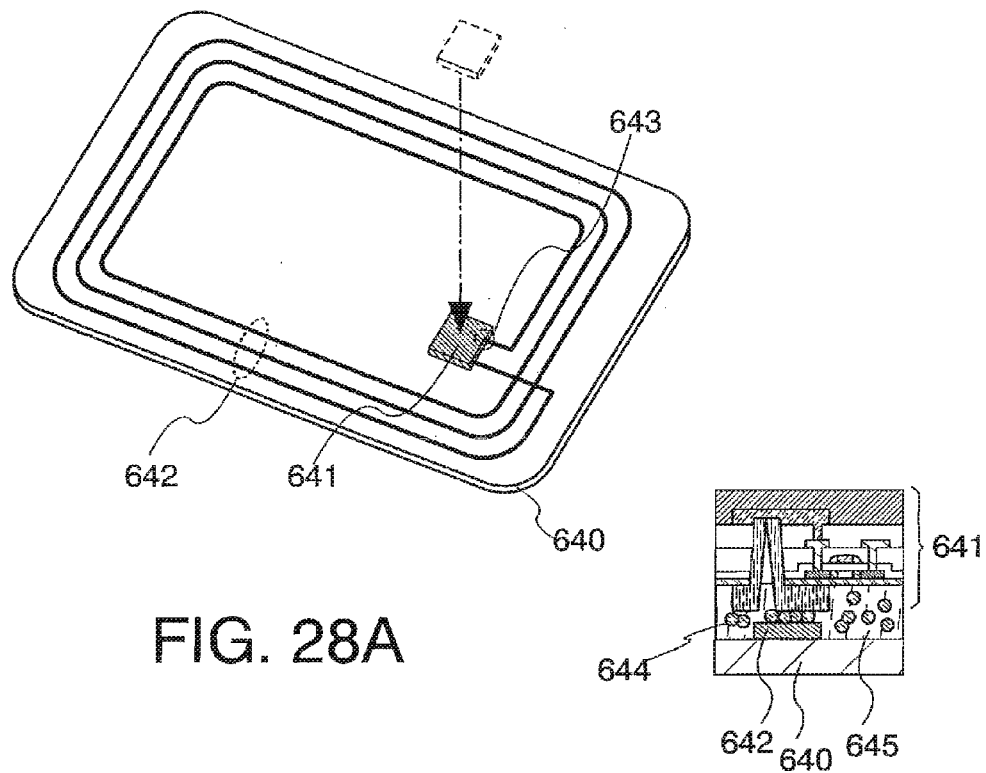
FIG. 28A
FIG. 28B
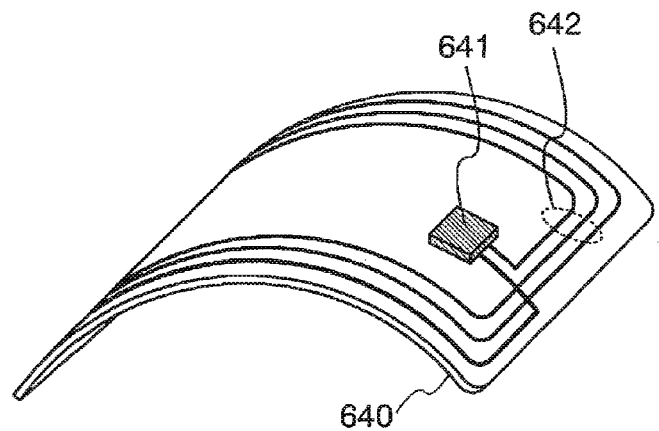
FIG. 28C

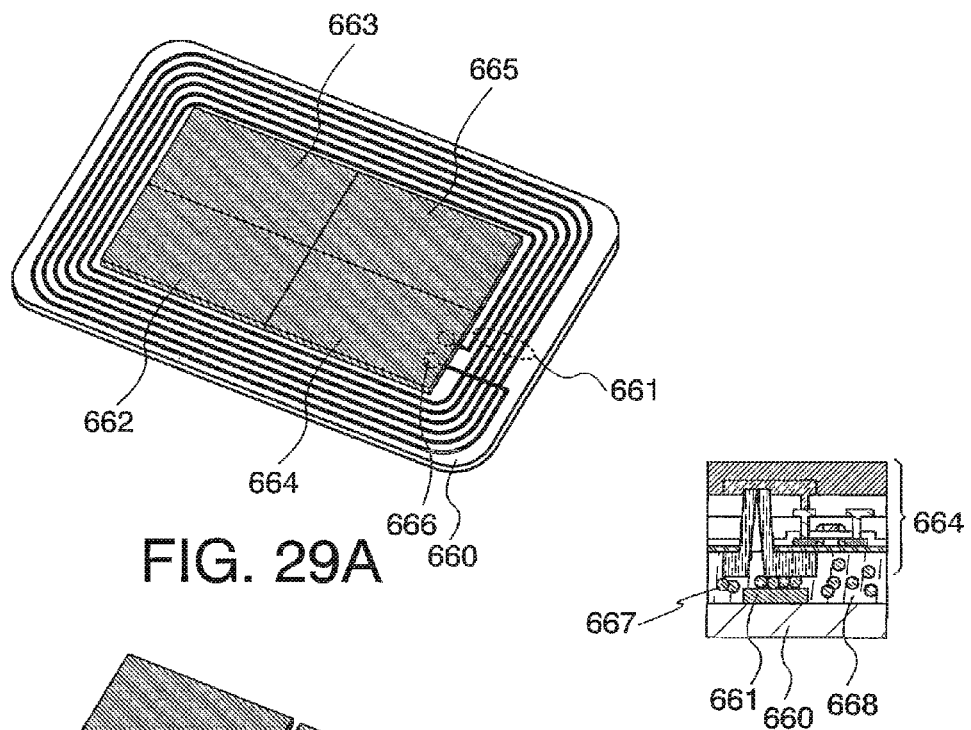
FIG. 29A
FIG. 29B
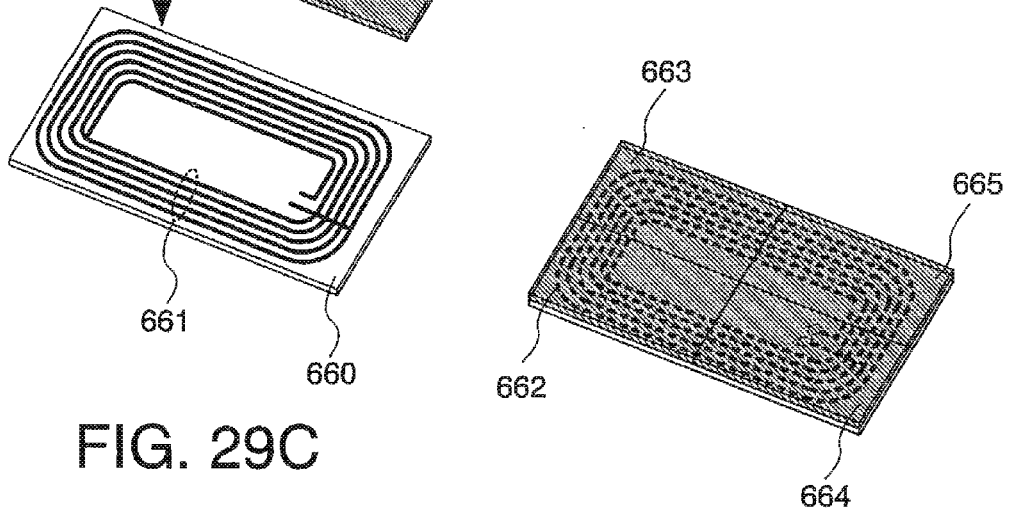
FIG. 29C
FIG. 29D

INTEGRATED CIRCUIT DEVICE AND METHOD FOR MANUFACTURING INTEGRATED CIRCUIT DEVICE

BACKGROUND OF THE INVENTION

1. Field of the Invention

The present invention relates to a method for manufacturing an integrated circuit device, and further, relates to an integrated circuit device, a product using an integrated circuit device, and a semiconductor device.

2. Description of the Related Art

In recent years, development of a technique for displacing a thin film circuit provided over an insulating substrate has been carried out. As such a technique, for example, there has been a technique by which a separation layer is provided between a thin film circuit and a substrate, the separation layer is removed by using a gas containing halogen to separate the thin film circuit from the supporting substrate, and then the thin film circuit is displaced over an object (see patent document 1).

[Patent document 1]: Japanese Patent Application Laid-Open No. Hei 8-254686

In the above mentioned technique disclosed in the patent document 1, a semiconductor integrated circuit having a structure in which a thin film transistor is sandwiched between a base film and an interlayer insulating film and a passivation film such as a silicon nitride film, and an electrode being electrically connected to the thin film transistor is formed over the passivation film, is separated from a substrate, and then the separated semiconductor integrated circuit is used as a driver circuit of a display device. That is, since the semiconductor integrated circuit is separated from the substrate while keeping a state where the electrode for connecting to an external portion is formed over the thin film transistor in advance, the electrode for connecting to an external portion is not formed under the thin film transistor.

SUMMARY OF THE INVENTION

It is an object of the present invention to provide a structure of an integrated circuit device and a method for manufacturing an integrated circuit device by which an electrode for connecting to an external portion can be easily formed under a thin film circuit.

To solve the above described problems, a first structure of an integrated circuit device of the present invention includes: a first insulating film; a layer including a thin film circuit formed over one surface of the first insulating film; a second insulating film formed over the thin film circuit; an electrode formed over the second insulting film and electrically connected to the thin film circuit; a resin film formed over the electrode; and a conductive film formed adjacent to the other surface of the first insulating film and electrically connected to the electrode.

Further, the conductive film is electrically connected to the electrode through a hole formed in the first insulating film, the layer including the thin film circuit, and the second insulating film.

Furthermore, the integrated circuit device of the present invention may have a hole formed in the first insulating film, the layer including the thin film circuit, the second insulating film, the electrode, and the resin film. In this case, the conductive film is electrically connected to the electrode through part of the hole formed in the first insulating film, the layer including the thin film circuit, and the second insulating film.

A second structure of an integrated circuit device of the present invention includes: a first insulating film, a layer including a thin film circuit formed over one surface of the first insulating film; a second insulating film formed over the thin film circuit; an electrode formed over the second insulating film and electrically connected to the thin film circuit; a third insulating film formed over the electrode; and a conductive film formed adjacent to the other surface of the first insulating film and electrically connected to the electrode.

A third structure of an integrated circuit device of the present invention includes: a substrate with a thickness of 100 μm or less; a first insulating film formed over one surface of the substrate; a layer including a thin film circuit formed over the first insulating film; a second insulating film formed over the thin film circuit; an electrode formed over the second insulating film and electrically connected to the thin film circuit; a third insulating film formed over the electrode; and a conductive film formed adjacent to the other surface of the substrate and electrically connected to the electrode.

Further, the conductive film is electrically connected to the electrode through a hole formed in the first insulating film, the layer including the thin film circuit, and the second insulating film.

Furthermore, the integrated circuit device of the present invention may have a hole formed in the first insulating film, the layer including the thin film circuit, the second insulating film, the electrode, and the third insulating film. In this case, the conductive film is electrically connected to the electrode through part of the hole formed in the first insulating film, the layer including the thin film circuit, and the second insulating film.

In each of the above described first and second structures of the integrated circuit device of the present invention, the thin film circuit formed in the layer including the thin film circuit has one or a plurality of elements selected from a thin film transistor, a resistor, a capacitor, and an inductor.

In another aspect of the present invention, a method for manufacturing an integrated circuit device having the first structure as described above, includes the steps of: forming a stacked body, which includes a first insulating film, a thin film circuit formed over one surface of the first insulating film, a second insulating film formed over the thin film circuit, an electrode formed over the second insulating film and electrically connected to the thin film circuit, and a resin film formed over the electrode; forming a conductive film adjacent to the other surface of the first insulating film included in the stacked body to be overlapped with the electrode; and irradiating the conductive film with a laser.

In another aspect of the present invention, a method for manufacturing an integrated circuit device having the second structure as described above, includes the steps of: forming a stacked body, which includes a first insulating film, a thin film circuit formed over one surface of the first insulating film, a second insulating film formed over the thin film circuit, an electrode formed over the second insulating film and electrically connected to the thin film circuit, and a third insulating film formed over the electrode; forming a conductive film adjacent to the other surface of the first insulating film included in the stacked body to be overlapped with the electrode; and irradiating the conductive film with a laser.

A method for manufacturing an integrated circuit device of the present invention includes the steps of: forming a stacked body, which includes a first substrate with a thickness of 100 μm or less, a first insulating film formed over the first substrate, a thin film circuit formed over one surface of the first insulating film, a second insulating film formed over the thin film circuit, an electrode formed over the second insulating film and electrically connected to the thin film circuit, a third insulating film formed over the electrode, and a second substrate formed over the third insulating film; forming a conductive film adjacent to the other surface of the first insulating film to be overlapped with the electrode; and irradiating the conductive film with a laser.

Further, in the above described method for manufacturing an integrated circuit device of the present invention, the thin film circuit has one or a plurality of elements selected from a thin film transistor, a resistor, a capacitor, and an inductor.

In an integrated circuit device of the present invention, a conductive film is formed adjacent to a layer different from a layer, over which an electrode being electrically connected to a thin film circuit is formed, to be overlapped with the electrode and the conductive film is irradiated with a laser so as to easily form a conductive film for connecting to an external portion, which is electrically connected to the electrode. Further, when the conductive film for connecting to an external portion, which is electrically connected to the electrode, is formed by laser irradiation, electric resistance of the electrode to the conductive film for connection can be reduced.

BRIEF DESCRIPTION OF THE DRAWINGS

In the accompanying drawings:

FIGS. 1A to 1C are cross sectional views explaining Embodiment Mode 1;
FIGS. 3A to 3C are cross sectional views explaining Embodiment Mode 1;
FIGS. 18A to 18C are cross sectional views explaining Embodiment Mode 5;
FIGS. 22A and 22B are cross sectional views explaining Embodiment Mode 5;
FIGS. 24A and 24B are cross sectional views explaining Embodiment Mode 1;
FIGS. 25A and 25B are cross sectional views explaining Embodiment Mode 1;
FIGS. 28A to 28C are diagrams explaining Embodiment 3;
FIGS. 29A to 29D are diagrams explaining Embodiment 4.

DETAILED DESCRIPTION OF THE INVENTION

Embodiment Modes

Embodiment Mode 1

Figure 2A:
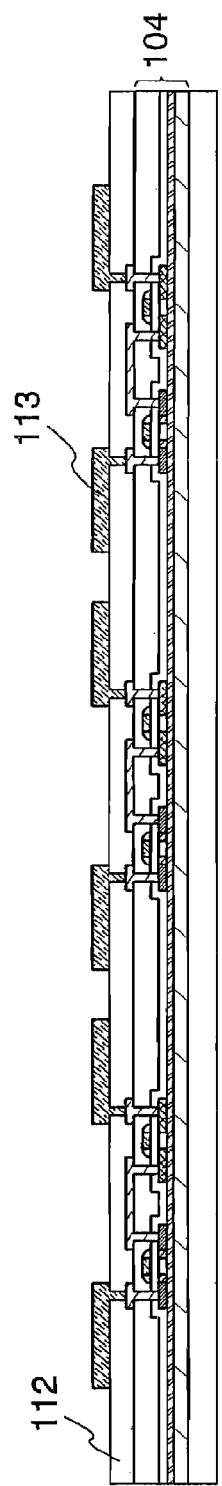
FIGS. 2A to 2C are cross sectional views explaining Embodiment Mode 1.

This embodiment mode will describe a method for manufacturing an integrated circuit device in a case of forming a circuit having a thin film transistor as a thin film circuit.

First, as shown in FIG. 1A, a separation layer 101 is formed over a substrate 100. As the separation layer 101, a single layer or a stacked layer is formed using an element selected from tungsten (W), molybdenum (Mo), titanium (Ti), tantalum (Ta), niobium (Nb), nickel (Ni), cobalt (Co), zirconium (Zr), zinc (Zn), ruthenium (Ru), rhodium (Rh), palladium (Pd), osmium (Os), iridium (Ir), and silicon (Si); or an alloy material or a compound material mainly containing the element, by plasma CVD, sputtering, or the like. A crystalline structure of a layer containing silicon may be any one of an amorphous structure, a microcrystalline structure, and a polycrystalline structure.

As the substrate 100, a quartz substrate, a semiconductor substrate, a glass substrate, a metal substrate, or the like may be used.

In a case where the separation layer 101 has a single layer structure, a layer containing any of tungsten; molybdenum; a mixture of tungsten and molybdenum; tungsten oxide; tungsten oxynitride; tungsten nitride oxide; molybdenum oxide; molybdenum oxynitride; molybdenum nitride oxide; oxide of a mixture of tungsten and molybdenum; oxynitride of a mixture of tungsten and molybdenum; and nitride oxide of a mixture of tungsten and molybdenum, is preferably formed. Note that the mixture of tungsten and molybdenum corresponds to an alloy of tungsten and molybdenum, for example.

In a case where the separation layer 101 has a stacked layer structure, a layer containing tungsten, molybdenum, or a mixture of tungsten and molybdenum is preferably formed as a first layer; and a layer containing tungsten oxide, molybdenum oxide, oxide of a mixture of tungsten and molybdenum, tungsten oxynitride, molybdenum oxynitride, or oxynitride of a mixture of tungsten and molybdenum is preferably formed as a second layer.

When the separation layer 101 is formed to have a stacked layer structure in such a manner, a stacked layer structure of a metal film and a metal oxide film is preferably used. As examples of a method for forming a metal oxide film, a method by which a metal oxide film is directly formed by sputtering; a method by which a surface of a metal film formed over the substrate 100 is oxidized by heat treatment or plasma treatment under an oxygen atmosphere to form a metal oxide film; and the like can be given. Preferably, a metal oxide film is formed on a surface of a metal film by performing high-density plasma treatment to the surface of the metal film under an atmosphere containing oxygen. For example, when a tungsten film is formed by sputtering as a metal film, the tungsten film is subjected to the high-density plasma treatment, making it possible to form a metal oxide film made from tungsten oxide on a surface of the tungsten film.

As the metal film, a film formed using an element selected from titanium (Ti), tantalum (Ta), niobium (Nb), nickel (Ni), cobalt (Co), zirconium (Zr), zinc (Zn), ruthenium (Ru), rhodium (Rh), palladium (Pd), osmium (Os), and iridium (Ir); or an alloy material or a compound material mainly containing the element, can be used, in addition to the above described tungsten (W), molybdenum (Mo).

In this specification, the "high-density plasma treatment" indicates treatment in which electron density of plasma is $1 \times 10^{11}$ cm$^{-3}$ or more and $1 \times 10^{13}$ cm$^{-3}$ or less, and an electron temperature of plasma is 0.5 eV or more and 1.5 eV or less. Since the electron temperature in the vicinity of an object (which corresponds to a metal film here) formed over a substrate is low while the electron density of plasma is high, damage due to plasma to the substrate can be prevented. Further, since the electron density of plasma is high as $1 \times 10^{11}$ cm$^{-3}$ or more, a dense film having an oxide film with a uniform thickness, which is formed by oxidation treatment, can be formed. Furthermore, the electron temperature of plasma is low as 1.5 eV or less, and therefore, oxidation treatment can be performed at a lower temperature as compared with normal plasma treatment or thermal oxidation. For example, even when plasma treatment is performed at a temperature lower than a strain point of a glass substrate by 100° C. or more (for example, 250 to 550° C.), plasma oxidation treatment can be sufficiently performed. Note that as a frequency for generating plasma, a microwave (2.45 GHz) is used. Further, potential of plasma is low as 5 V or less so that excessive dissociation of molecules of a raw material can be suppressed.

As an atmosphere containing oxygen, a mixed gas of oxygen ($O_2$) or dinitrogen monoxide ($N_2O$) and a rare gas, or a mixed gas of oxygen ($O_2$) or dinitrogen monoxide ($N_2O$), a rare gas, and hydrogen ($H_2$) can be used. As the rare gas, argon (Ar), xenon (Xe), krypton (Kr), and the like can be given. Further, a pressure ratio of respective gases contained in the mixed gas may be appropriately determined. A metal oxide film formed under this condition becomes a film containing a rare gas element. Since the electron temperature is low (1.5 eV or less) and the electron density is high ($1.0 \times 10^{11}$ cm$^{-3}$ or more) in the plasma condition, a metal oxide film can be formed at a low temperature with extremely less plasma damage.

Note that prior to forming the separation layer 101, an insulating film such as a silicon oxide film, a silicon nitride film, a silicon oxynitride film, or a silicon nitride oxide film may be formed over the substrate 100 and then the separation layer 101 may be formed over the insulating film. By providing such an insulating film between the substrate 100 and the separation layer 101, an impurity contained in the substrate 100 can be prevented from intruding into an upper layer. In addition, in a subsequent laser irradiation step, the substrate 100 can be prevented from being etched. Note that a silicon oxynitride film and a silicon nitride oxide film are separately used here. The silicon oxynitride film contains larger amounts of oxygen than nitrogen whereas the silicon nitride oxide film contains larger amounts of nitrogen than oxygen.

Next, as shown in FIG. 1B, a first insulating film 102 is formed to be in contact with the separation layer 101. The first insulating film 102 serves as a base film. The first insulating film 102 is formed using silicon oxide, silicon nitride, silicon oxide containing nitrogen, silicon nitride containing oxygen, or the like by plasma CVD, sputtering, or the like.

As shown in FIG. 1C, a layer 104 including circuits 103 having thin film transistors is formed over the first insulating film 102 by a known method. As the layer 104 including the circuits 103 having the thin film transistors, for example, a plurality of thin film transistors, a second insulating film 110 covering the plurality of thin film transistors, and source and drain wirings 111 being in contact with the second insulating film 110 and connecting to source regions and drain regions of the plurality of thin film transistors, are formed. A single thin film transistor includes an island-like semiconductor film 107, a gate insulating film 108, a gate electrode 109 provided with a sidewall, and the like. As the circuits 103 including the thin film transistors, circuits each having a structure, which includes an N-channel thin film transistor 105 and a P-channel thin film transistor 106, is shown as an example in FIG. 1C; however, the present invention is not limited to such a structure. Further, FIG. 1C shows an example in which top-gate thin film transistors each having a gate electrode provided with a sidewall and an LDD region (a low concentration impurity region) are formed as the N-channel thin film transistors 105 and top-gate thin film transistors each having a gate electrode provided with a sidewall is formed as the P-channel thin film transistors 106; however, the structures of the thin film transistors are not limited thereto. A known structure of a thin film transistor such as a thin film transistor having no LDD region (no low concentration impurity region), a bottom-gate thin film transistor, or a thin film transistor having a silicide region, is applicable.

An example of a method for forming the layer 104 including the circuits 103 having the thin film transistors will be described in detail below.

First, an amorphous semiconductor film is formed over the first insulating film 102. The amorphous semiconductor film is formed by sputtering or various types of CVD such as plasma CVD. Subsequently, the amorphous semiconductor film is crystallized to form a crystalline semiconductor film. As a crystallization method, laser crystallization, thermal crystallization using RTA or an annealing furnace, thermal crystallization using a metal element for promoting crystallization, thermal crystallization using a metal element for promoting crystallization with laser crystallization, or the like can be used. Thereafter, the obtained crystalline semiconductor film is patterned into a desired shape to form island-like semiconductor films 107. Note that the separation layer 101, the first insulating film 102, and the amorphous semiconductor film can be successively formed without being exposed to atmospheric air.

An example of a method for forming a crystalline semiconductor film will be briefly described below. As a method for crystallizing an amorphous semiconductor film, laser crystallization, thermal crystallization using RTA or an annealing furnace, thermal crystallization using a metal element for promoting crystallization, thermal crystallization using a metal element for promoting crystallization with laser crystallization, or the like can be given. Further, as other crystallization method, crystallization may be performed by generating thermal plasma by applying DC bias and making the thermal plasma affect to a semiconductor film.

When employing laser crystallization, a continuous wave laser beam (CW laser beam) or a pulsed laser beam (pulse laser beam) can be used. As a usable laser beam, a beam oscillated from one or plural kinds of a gas laser such as an Ar laser, a Kr laser, or an excimer laser; a laser using, as a medium, single crystalline YAG, YVO$_4$, forsterite (Mg$_2$SiO$_4$), YAlO$_3$, or GdVO$_4$ or polycrystalline (ceramic) YAG, Y$_2$O$_3$, YVO$_4$, YAlO$_3$, or GdVO$_4$ doped with one or more of Nd, Yb, Cr, Ti, Ho, Er, Tm, and Ta as a dopant; a glass laser; a ruby laser; an alexandrite laser; a Ti: sapphire laser; a copper vapor laser; and a gold vapor laser, can be used. The amorphous semiconductor film is irradiated with a laser beam having a fundamental wave of such a laser or a second to a fourth harmonic of a fundamental wave thereof to obtain a crystal with a large grain size. For instance, the second harmonic (532 nm) or the third harmonic (355 nm) of an Nd:YVO$_4$ laser (fundamental wave of 1,064 nm) can be used. In this case, energy density of about 0.01 to 100 MW/cm$^2$ (preferably, 0.1 to 10 MW/cm$^2$) is required for a laser. The scanning rate is set to be about 10 to 2,000 cm/sec to irradiate the semiconductor film with the laser.

Note that each laser using, as a medium, single crystalline YAG, YVO$_4$, forsterite (Mg$_2$SiO$_4$), YAlO$_3$, or GdVO$_4$ or polycrystalline (ceramic) YAG, Y$_2$O$_3$, YVO$_4$, YAlO$_3$, or GdVO$_4$ doped with one or more of Nd, Yb, Cr, Ti, Ho, Er, Tm, and Ta as a dopant; an Ar ion laser; and a Ti: sapphire laser, can continuously oscillate. Further, pulse oscillation thereof can be performed with an oscillation frequency of 10 MHz or more by carrying out Q switch operation or mode synchronization. When a laser beam is oscillated with an oscillation frequency of 10 MHz or more, a semiconductor film is irradiated with a next pulse during a period where the semiconductor film is melted by the laser beam and then is solidified. Therefore, differing from a case of using a pulsed laser with a low oscillation frequency, a solid-liquid interface can be continuously moved in the semiconductor film so that crystal grains, which continuously grow toward a scanning direction, can be obtained.

When an amorphous semiconductor film is crystallized by using a continuous wave laser or a laser beam which is oscillated at a frequency of 10 MHz or more, a surface of the crystallized semiconductor film can be planarized. As a result, the gate insulating film 108, which will be formed later, can be formed thinly. In addition, this contributes to the improvement the breakdown voltage of the gate insulating film 108.

When ceramic (polycrystal) is used for the medium, the medium can be formed to have a free shape for a short time at low cost. When using a single crystal, a columnar medium with several mm in diameter and several tens of mm in length is usually used. Meanwhile, in the case of using the ceramic, a medium bigger than the case of using the single crystal can be formed.

A concentration of a dopant such as Nd or Yb in a medium, which directly contributes to light emission, cannot be changed largely in both cases of the single crystal and the polycrystal, and therefore, there is a limitation in improvement in output of a laser by increasing the concentration of the dopant to some extent. However, in the case of the ceramic, the size of the medium can be significantly increased as compared with the case of the single crystal, and therefore, drastic improvement in output of a laser can be expected.

Further, in the case of the ceramic, a medium with a parallelepiped shape or a rectangular parallelepiped shape can be easily formed. In a case of using a medium having such a shape, when oscillated light is made travel in a zig-zag manner inside the medium, a path of the oscillated light can be made long. Therefore, amplitude is increased and a laser beam can be oscillated at high output. Furthermore, a cross section of a laser beam emitted from a medium having such a shape has a quadrangular shape, and therefore, as compared with a laser beam with a circular shape, the laser beam with the quadrangular shape in the cross section is more favorably shaped into a linear beam. By shaping a laser beam emitted in the above described manner using an optical system, a linear beam with 1 mm or less in length of a short side and several mm to several m in length of a long side can be easily obtained. In addition, when a medium is uniformly irradiated with excited light, a linear beam is emitted with a uniform energy distribution in a long side direction.

When a semiconductor film is irradiated with this linear beam, the semiconductor film can be uniformly annealed. In a case where uniform annealing is required from one end to the other end of the linear beam, an ingenuity in which slits are provided in the both ends of the linear beam so as to shield an attenuated portion of energy from light, or the like may be performed.

When a semiconductor film is annealed by using the thus obtained linear beam with uniform intensity and a semiconductor device is manufactured by using this semiconductor film, a characteristic of the semiconductor device can be made favorable and uniform.

As thermal crystallization using a metal element for promoting crystallization, an example of a specific method will be given. After keeping a solution containing nickel, which is a metal element for promoting crystallization, over an amorphous semiconductor film, the amorphous semiconductor film is subjected to dehydrogenation treatment (500° C. for one hour) and thermal crystallization treatment (550° C. for four hours) so as to form a crystalline semiconductor film. Thereafter, the crystalline semiconductor film is irradiated with a laser beam if required, and then, the crystalline semiconductor film is patterned by photolithography to form the island-like semiconductor films 107.

The thermal crystallization using a metal element for promoting crystallization has advantages of being capable of crystallizing an amorphous semiconductor film at a low temperature for a short time and aligning a direction of crystals; however, the thermal crystallization has drawbacks that off current is increased due to a residue of the metal element in the crystalline semiconductor film and characteristics of the crystalline semiconductor film are not stabilized. Therefore, it is preferable to form an amorphous semiconductor film serving as a gettering site over the crystalline semiconductor film. Since the amorphous semiconductor film, which becomes the gettering site, is necessary to contain an impurity element such as phosphorus or argon, the amorphous semiconductor film is preferably formed by sputtering by which the amorphous semiconductor film can contain argon at a high concentration. Thereafter, heat treatment (RTA, thermal annealing using an annealing furnace, or the like) is performed to disperse the metal element to the amorphous semiconductor film. Subsequently, the amorphous semiconductor film containing the metal element is removed. By carrying out such the gettering process, the amount of the metal element contained in the crystalline semiconductor film can be reduced or the metal element can be removed.

Next, the gate insulating film 108 is formed to cover the island-like semiconductor films 107. As the gate insulating film 108, a single layer or a stacked layer is formed by using a film containing silicon oxide or silicon nitride by sputtering or various types of CVD such as plasma CVD. Specifically, the gate insulating film 108 is formed by using a single layer of a film containing silicon oxide, a film containing silicon oxynitride, or a film containing silicon nitride oxide, or by appropriately stacking these films. Alternatively, the island-like semiconductor films 107 may be subjected to the above described high-density plasma treatment under an atmosphere containing oxygen, nitrogen, or both of oxygen and nitrogen to oxidize or nitride each surface of the island-like semiconductor films 107 so as to form the gate insulating film. The gate insulating film formed by the high-density plasma treatment has superior uniformity in film thickness and film quality as compared with a film formed by CVD or sputtering. In addition, a dense film can be formed as the gate insulating film by the high-density plasma treatment. As an atmosphere containing oxygen, a mixed gas of oxygen ($O_2$), nitrogen dioxide ($NO_2$) or dinitrogen monoxide ($N_2O$), and a rare gas; or a mixed gas of oxygen ($O_2$), nitrogen dioxide ($NO_2$) or dinitrogen monoxide ($N_2O$), a rare gas, and hydrogen ($H_2$); can be used. Further, as an atmosphere containing nitrogen, a mixed gas of nitrogen ($N_2$) or ammonia ($NH_3$) and a rare gas; or a mixed gas of nitrogen ($N_2$) or ammonia ($NH_3$), a rare gas, and hydrogen ($H_2$), can be used. Each surface of the island-like semiconductor films 107 can be oxidized or nitrided by oxygen radical (which contains OH radical in some cases) or nitrogen radical (which contains NH radical in some cases) generated by high-density plasma.

When the gate insulating film 108 is formed by the high-density plasma treatment, an insulating film with a thickness of 1 to 20 nm, and typically, 5 to 10 nm, is formed over the island-like semiconductor films 107. A reaction in this case is a solid-phase reaction, and therefore, interface state density between the insulating film and the island-like semiconductor films 107 can be extremely reduced. Further, since the island-like semiconductor films 107 are directly oxidized or nitrided, variations in thickness of the gate insulating film 108 can be suppressed significantly and ideally. Furthermore, since strong oxidation is not generated in a crystal grain boundary of crystalline silicon, an extremely preferable state is made. That is, when the surface of the semiconductor films is subjected to solid-phase oxidation by the high-density plasma treatment shown here, an insulating film with low interface state density and good uniformity can be formed without generating abnormal oxidation reaction in a crystal grain boundary.

Note that, as the gate insulating film 108, only an insulating film formed through the high-density plasma treatment may be used. Alternatively, the insulating film formed through the high-density plasma treatment and another insulating film formed using silicon oxide, silicon nitride containing oxygen, or silicon oxide containing nitrogen by CVD utilizing plasma or a thermal reaction may be stacked to form the gate insulating film 108. In either case, when a transistor partly or entirely including an insulating film formed by high-density plasma is formed, variations in characteristics can be reduced.

Further, the crystalline semiconductor film, which is formed by crystallizing the amorphous semiconductor film by irradiation of a continuous wave laser beam or a laser beam oscillated at a frequency of 10 MHz or more while scanning the amorphous semiconductor film with the laser beam in one direction, has a characteristic that crystals grow in a scanning direction of the laser beam. Therefore, when a transistor is disposed such that the scanning direction corresponds to a channel length direction (a direction of flowing carries when a channel region is formed), and the gate insulating film 108 formed by the high-density plasma treatment is combined with the transistor, a transistor with lesser variations in characteristics and high electron field-effect mobility can be obtained.

Next, gate electrodes 109 are formed over the gate insulating film 108. The gate electrodes 109 may be formed by sputtering or various types of CVD such as plasma CVD. Further, the gate electrodes 109 can be formed by using an element selected from tantalum (Ta), tungsten (W), titanium (Ti), molybdenum (Mo), aluminum (Al), copper (Cu), chromium (Cr), niobium (Nb), and the like; or an alloy material or a compound material mainly containing these elements. Further, the gate electrodes can be formed by using a semiconductor material typified by polycrystalline silicon doped with an impurity element such as phosphorus.

Next, impurity elements are selectively added to the island-like semiconductor films 107 by ion doping or ion implantation to form N-channel thin film transistors 105 and P-channel thin film transistors 106. Note that in FIG. 1C, LDD regions (low concentration impurity regions) are formed using insulating films (sidewalls) in contact with a side surface of each gate electrode 109 in each of the N-channel thin film transistors 105. As an impurity element imparting N-type conductivity used for forming the N-channel thin film transistors 105, an element belonging to Group 15 of the periodic table may be used, and for example, phosphorus (P) or arsenic (As) is used. Further, as an impurity element imparting P-type conductivity used for forming the P-channel thin film transistors 106, an element belonging to Group 13 may be used, and for example, boron (B) is used.

After completing the N-channel thin film transistors 105 and the P-type thin film transistors 106 through the above described steps, heat treatment for recovering crystallinity of the semiconductor films or activating the impurity elements added to the semiconductor films, may be performed. Further, after performing the heat treatment, the exposed gate insulating film 108 may be subjected to high-density plasma treatment under an atmosphere containing hydrogen so that a surface of the gate insulating film 108 may contain hydrogen. This is because the hydrogen can be utilized when performing a step of hydrogenating the semiconductor films later. Further, by performing high-density plasma treatment under an atmosphere containing hydrogen while heating the substrate at 350 to 450° C., hydrogenation of the semiconductor films can be performed. Further, as the atmosphere containing hydrogen, a mixed gas of hydrogen ($H_2$) or ammonia ($NH_3$) and a rare gas (for example, argon (Ar)) can be used. When a mixed gas of ammonia ($NH_3$) and a rare gas (for example, argon (Ar)) is used as the atmosphere containing hydrogen, the surface of the gate insulating film 108 can be hydrogenated and nitrided at the same time.

Then, a second insulating film 110 is formed to cover the plurality of thin film transistors. The second insulating film 110 is formed using a single layer or a stacked layer made from an inorganic material such as silicon oxide or silicon nitride; an organic material such as polyimide, polyamide, benzocychlobutene, acrylic, or epoxy; siloxane; or the like, by an SOG technique, a droplet discharging method, or the like. In this specification, siloxane has a skeleton structure including silicon (Si)-oxygen (O) bonds and an organic group containing at least hydrogen (for example, an alkyl group, aromatic hydrocarbon, or the like) is used as a substituent. Further, as the substituent, a fluoro group may be used, or both of an organic group containing at least hydrogen and a fluoro group may be used. For example, in a case where the second insulating film 110 has a three layer structure, a film mainly containing silicon oxide may be formed as a first insulating film, a film mainly containing a resin may be formed as a second insulating film, and a film mainly containing silicon nitride may be formed as a third insulating film. Further, in a case where the second insulating film 110 has a single layer structure, a silicon nitride film or a silicon nitride film containing oxygen may be formed. In this case, it is preferable that by performing high-density plasma treatment under an atmosphere containing hydrogen with respect to the silicon nitride film or the silicon nitride film containing oxygen, hydrogen be contained in a surface of the silicon nitride film or the silicon nitride film containing oxygen. This is because when performing a hydrogenation step of the island-like semiconductor films 107 later, this hydrogen can be utilized. Further, by performing high-density plasma treatment under an atmosphere containing hydrogen while heating the substrate at 350 to 450° C., hydrogenation of the semiconductor films can be performed. Note that, as the atmosphere containing hydrogen, a mixed gas of hydrogen ($H_2$) or ammonia ($NH_3$) and a rare gas (for example, argon (Ar)) can be used. When a mixed gas of ammonia ($NH_3$) and a rare gas (for example, argon (Ar)) is used as the atmosphere containing hydrogen, the surface of the gate insulating film 108 can be hydrogenated and nitrided at the same time.

Note that, prior to forming the second insulating film 110, heat treatment for recovering crystallinity of the semiconductor films, activating the impurity elements added to the semiconductor films, or hydrogenating the semiconductor films, is preferably performed. The heat treatment preferably employs thermal annealing, laser annealing, RTA, or the like. For example, in order to activate the impurity elements, thermal annealing at 500° C. or more is preferably performed. Further, in order to hydrogenate the semiconductor films, thermal annealing at 350 to 450° C. may be performed.

Next, the second insulating film 110 and the gate insulating film 108 are etched by photolithography to form contact holes by which the island-like semiconductor films 107 are exposed. Subsequently, a conductive film is formed to fill the contact holes. The conductive film is patterned to form source or drain wirings 111.

The source or drain wirings 111 are formed by using a conductive film mainly containing aluminum (Al) by sputtering, various types of CVD such as plasma CVD, or the like. The conductive film mainly containing aluminum (Al) corresponds to a material mainly containing aluminum, which also contains nickel, or an alloy material mainly containing aluminum, which also contains nickel and one or both of carbon and silicon, for example. Since the conductive film mainly containing aluminum generally has a drawback of a poor heat resistance property, an upper surface and a lower surface of the conductive film mainly containing aluminum are preferably covered with barrier films. The barrier films indicate films having a function of suppressing heroic of the conductive film mainly containing aluminum or improving a heat resistance property. As a material having such a function, chromium, tantalum, tungsten, molybdenum, titanium, silicon, and nickel, or nitride of these elements can be given. As an example of a structure of each of the source or drain wirings 111, a structure in which a titanium film, an aluminum film, and another titanium film are sequentially stacked from a substrate side, can be given. Since titanium is an element having a high reducing property, even when a thin oxide film is naturally formed on the crystalline semiconductor film, the oxide film naturally formed can be reduced by the titanium so that the titanium film can be well-contacted to the crystalline semiconductor film. Further, the titanium film formed between the crystalline semiconductor film and the aluminum film, is preferably subjected to high-density plasma treatment under an atmosphere containing nitrogen to nitride a surface of the titanium film. In a condition of the high-density plasma treatment, electron density of plasma is $1 \times 10^{11}$ cm$^{-3}$ or more and $1 \times 10^{13}$ cm$^{-3}$ or less, and an electron temperature of plasma is 0.5 eV or more and 1.5 eV or less. As the atmosphere containing nitrogen, a mixed gas of $N_2$ or $NH_3$ and a rare gas, or a mixed gas of $N_2$ or $NH_3$, a rare gas, and $H_2$ can be used. Nitriding the surface of the titanium film makes it possible to prevent alloying of titanium and aluminum and prevent aluminum from dispersing in the crystalline semiconductor film through the titanium film in a step of heat treatment or the like, which will be performed later. Note that an example of sandwiching the aluminum film with the titanium films is described here, and this is the same for a case of using chromium films, tungsten films, or the like instead of the titanium films. More preferably, formation of the titanium film, nitriding treatment of the surface of the titanium film, formation of the aluminum film, and formation of another titanium film are successively carried out by using a multi-chamber apparatus without exposing these films to atmospheric air.

According to the above described steps, the layer 104 including the circuits 103 having the thin film transistors is formed.

Next, as shown in FIG. 2A, a third insulating film 112 is formed over the layer 104 including the circuits 103 having the thin film transistors. Subsequently, electrodes 113, which are electrically connected to wirings of the circuits 103 including the thin film transistors, are formed over the third insulating film 112 by using a metal film or the like. As the electrodes 113, a TiN film is formed by sputtering here.

The third insulating film 112 is formed using a single layer or a stacked layer made from an inorganic material such as silicon oxide, silicon nitride, silicon oxynitride, or silicon nitride oxide; an organic material such as polyimide, polyamide, benzocyclobutene, acrylic, or epoxy; siloxane, or the like, by a known method.

Further, although the electrodes 113 are formed to be connected to the source or drain wirings of the thin film transistors in FIG. 2A, the present invention is not limited to this case. An electrode may be formed at a portion to be electrically connected to an external circuit in each thin film circuit.

Figure 2B:
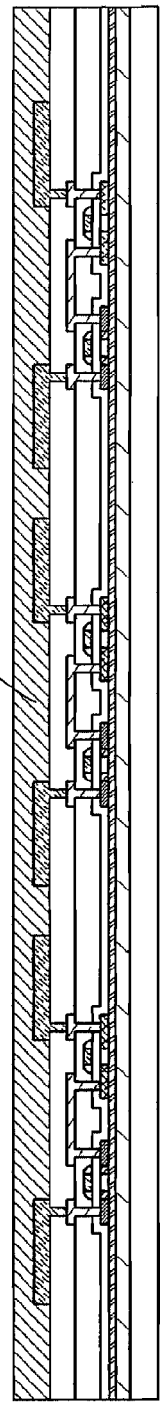

After forming the electrodes 113, a resin film 114 is formed over the electrodes 113 to have a thickness of 20 to 30 μm as shown in FIG. 2B. A resin material such as a heat curing resin, a UV (ultraviolet) curing resin, or a thermoplastic resin is applied over the electrodes 113 by screen printing, and then baked to form the resin film here.

Figure 2C:
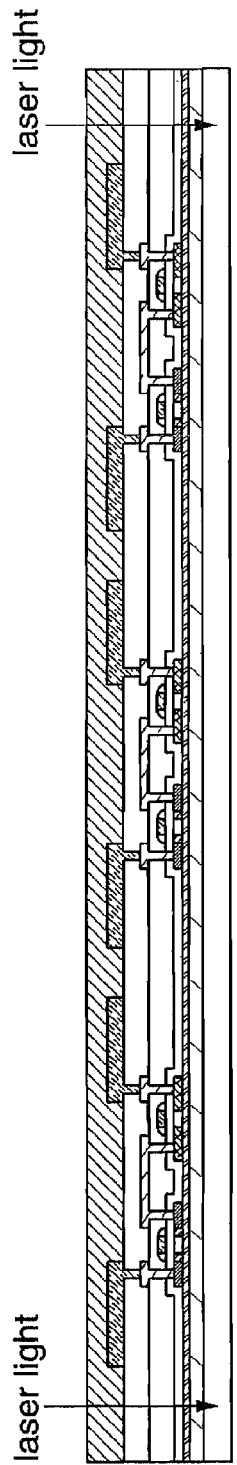

Subsequently, as shown in FIG. 2C, the substrate is irradiated with a laser with a wavelength in an ultraviolet region (hereinafter, referred to as a UV laser) to form opening portions 115 and 116 as shown in FIG. 3A. In this case, by forming the opening portions 115 and 116, the separation layer 101 is partly removed so that a stacked body 118 including the first insulating film 102, the layer 104 including the circuits 103 having the thin film transistors, the third insulating film 112, the electrodes 113, and the resin film 114 can be easily separated from the substrate 100. The stacked body is separated from the substrate at a boundary between an interior portion of the separation layer 101 or the separation layer 101 and the first insulating film 102.

Further, the UV laser is used in this embodiment mode; however, a type of a laser used in the present invention is not particularly limited so long as it can form the opening portions 115 and 116. A laser includes a laser medium, an excitation source, and a resonator. When lasers are classified based on mediums, there as a gas laser, a liquid laser, and a solid laser. When lasers are classified based on characteristics of oscillation, there are a free electron laser, a semiconductor laser, and an X-ray laser. Any laser can be used in the present invention. Note that a gas laser or a solid laser is preferably used. More preferably, a solid laser is used.

As a gas laser, there are a helium-neon laser, a carbon dioxide gas laser, an excimer laser, and an argon ion laser. As an excimer laser, there are a rare gas excimer laser and a rare gas halide laser. A rare gas excimer laser gives oscillations generated by three kinds of excited molecules of argon, krypton, and xenon. As an argon ion laser, there are a rare gas ion laser and a metal vapor ion laser.

As a liquid laser, there are an inorganic liquid laser, an organic chelate laser, and a dye laser. Each of the inorganic liquid laser and the organic chelate laser utilizes a rare earth ion such as neodymium, which is used for a solid laser, as a laser medium.

A laser medium used for a solid laser is a solid body doped with active species providing laser action. The solid body indicates a crystal or glass. The crystal indicates YAG (an yttrium, aluminum, garnet crystal), YLF, $YVO_4$, $YAlO_3$, sapphire, ruby, or alexandrite. Further, the active species providing laser action is a trivalent ion ($Cr^{3+}$, $Nd^{3+}$, $Yb^{3+}$, $Tm^{3+}$, $Ho^{3+}$, $Er^{3+}$, $Ti^{3+}$, etc.), for example.

Further, when using ceramic (a polycrystal), a medium can be formed to have a free shape for a short time at low cost. When using a single crystal, generally, a columnar medium with a diameter of several mm and a length of several tens of mm is used. In a case of using ceramic (a polycrystal), a medium with larger size can be formed. A concentration of a dopant such as Nd or Yb in a medium, which directly contributes to light emission, cannot be changed largely in both cases of the single crystal and the polycrystal, and therefore, there is a limitation in improvement in output of a laser by increasing the concentration of the dopant to some extent. However, in the case of the ceramic, the size of a medium can be significantly increased as compared with the case of the single crystal, and therefore, drastic improvement in output of a laser can be expected. Further, in the case of the ceramic, a medium with a parallelepiped shape or a rectangular parallelepiped shape can be easily formed. In a case of using a medium having such a shape, when oscillated light is made travel in a zigzag manner inside the medium, a path of the oscillated light can be made long. Therefore, amplitude is increased and a laser beam can be oscillated at high output. Furthermore, a cross section of a laser beam emitted from a medium having such a shape, has a quadrangular shape, and therefore, as compared with a laser beam with a circular shape, the laser beam with the quadrangular shape in cross section have an advantage to be shaped into a linear beam. By shaping a laser beam emitted in the above described manner using an optical system, a linear beam with 1 mm or less in length of a short side and several mm to several m in length of a long side can be easily obtained. In addition, when a medium is uniformly irradiated with excited light, a linear beam is emitted with a uniform energy distribution in a long side direction. When a semiconductor film is irradiated with this linear beam, the semiconductor film can be uniformly annealed. In a case where uniform annealing is required from one end to the other end of the linear beam, an ingenuity in which slits are provided in the both ends of the linear beam so as to shield an attenuated portion of energy from light, or the like may be performed As a laser used in the present invention, either a continuous wave laser beam (a CW laser beam) or a pulsed oscillation laser beam (a pulsed laser beam) can be used. Further, laser irradiation conditions such as a frequency, power density, energy density, and a beam profile are arbitrarily controlled in consideration of thicknesses, materials or the like of the first insulating film 102, the layer 104 including the circuits 103 having the thin film transistors, the third insulating film 112, the electrodes 113, and the resin film 114.

In order to separate the stacked body 118 including the first insulating film 102, the layer 104 including the circuits 103 having the thin film transistors, the third insulating film 112, the electrodes 113, and the resin film 114 from the substrate 100, a first film 117 is attached to a surface of the resin film 114 and the first film 117 is pulled in a direction of an arrow as shown in FIG. 3B so that the stacked body 118 including the first insulating film 102, the layer 104 including the circuits 103 having the thin film transistors, the third insulating film 112, the electrodes 113, and the resin film 114 is separated from the substrate 100. In this case, the substrate 100 and the stacked body 118 are separated from each other at a boundary between an interior portion of the separation layer 101 or the separation layer 101 and the first insulating film 102. In the stacked body 118 separated from the substrate 100, the first insulating film 102 becomes an outermost surface. The resin film 114 secures strength when separating the substrate 100 and the stacked body 118 from each other by pulling the first film 117. The stacked body 118 can be prevented from breaking in this step by the resin film 114.

The first film 117 has a structure in which an adhesive layer is provided on a base film made from a resin material. For example, a hot melt film, a UV (ultraviolet) separating film, a heat separating film, and the like can be given. As a material used for the base film, polyester, PET (polyethylene terephthalate), PEN (polyethylene naphthalate), and the like can be given.

A hot melt film has a structure in which over a base film, an adhesive layer made from a resin having a softening point, which is lower than that of the base film, is formed. A polyethylene resin, polyester, EVA (ethylene vinyl acetate), and the like can be given for a material used for the adhesive layer. Further, a UV (ultraviolet) separating film has a structure in which an adhesive layer made from a resin material whose adhesion is weakened by being irradiated with a UV (ultraviolet) ray, is formed over a base film. A heat separating film has a structure in which an adhesive layer made from a resin material whose adhesion is weakened by heating is formed over a base film.

Then, as shown in FIG. 3C, conductive films 119 each having a thickness of 1 µm to several tens of µm, and preferably, 10 µm to 20 µm, are formed over a surface of the first insulating film 102 (a back surface of a thin film circuit), i.e., the surface of the insulating film 102 on which the layer 104 including the circuits 103 having the thin film transistors is not formed, such that the conductive films are overlapped with the electrodes 113. The conductive films 119 may be formed using a conductive material such as an Au paste, an Ag paste, a Cu paste, an Ni paste, or an Al paste, solder, or the like by screen printing, for example. When each thickness of the conductive films 119 is 0.1 µnm or less, the conductive films cannot be electrically connected to the electrodes 113 in a subsequent step because of their excessive thin thickness.

Figure 4A:
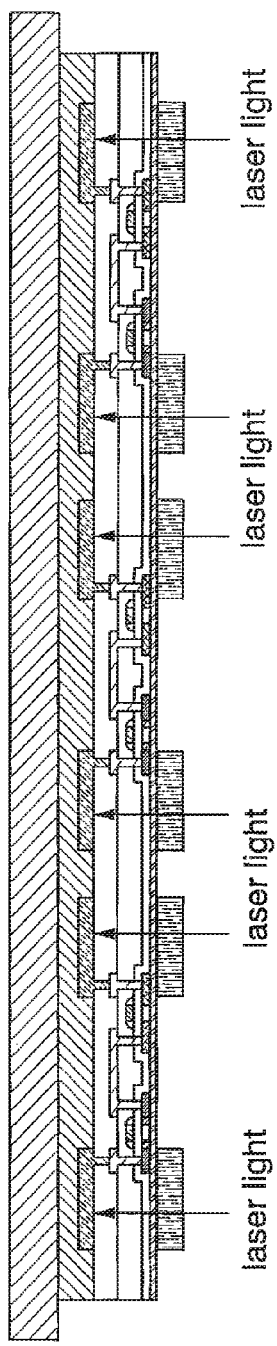
FIGS. 4A to 4C are cross sectional views explaining Embodiment Mode 1.
Figure 4B:
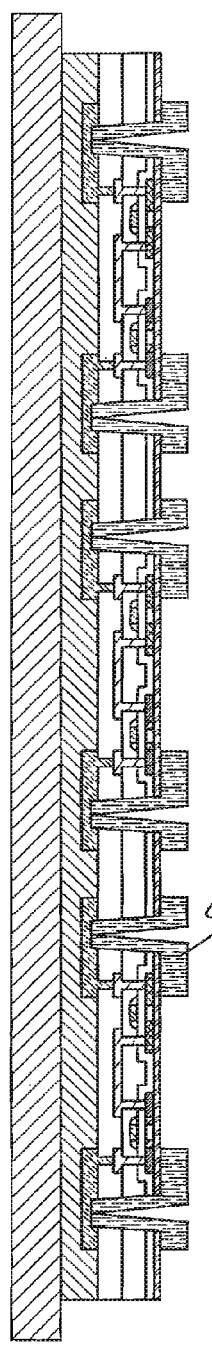

Then, as shown in FIG. 4A, the conductive films 119 are irradiated with laser beams. In this case, output of a laser is adjusted such that the conductive films 119 are moved to reach the electrodes 113 and the moved conductive films 119 are stopped at the electrodes 113. Laser irradiation is performed by using an Nd:$YVO_4$ pulse laser with a laser wavelength of 266 nm under conditions of an oscillation frequency of 15 kHz and an average output of 3 W. These conditions are typical conditions and the present invention is not limited thereto. The conductive films 119 and the electrodes 113 are electrically connected to one another by the laser irradiation, and hence, a state shown in FIG. 4B is obtained. In FIG. 4B, reference numeral 120 indicates one of the conductive films being electrically connected to one electrode 113.

As shown in FIG. 4B, holes are formed in the layer 104 including the circuits 103 having the thin film transistors and the third insulating film 112 at positions irradiated with the laser beams, and a material of the conductive films 119 is moved to the electrodes 113 along side walls of the holes; therefore, the conductive films 119 are electrically connected to the electrodes 113.

Figure 32:
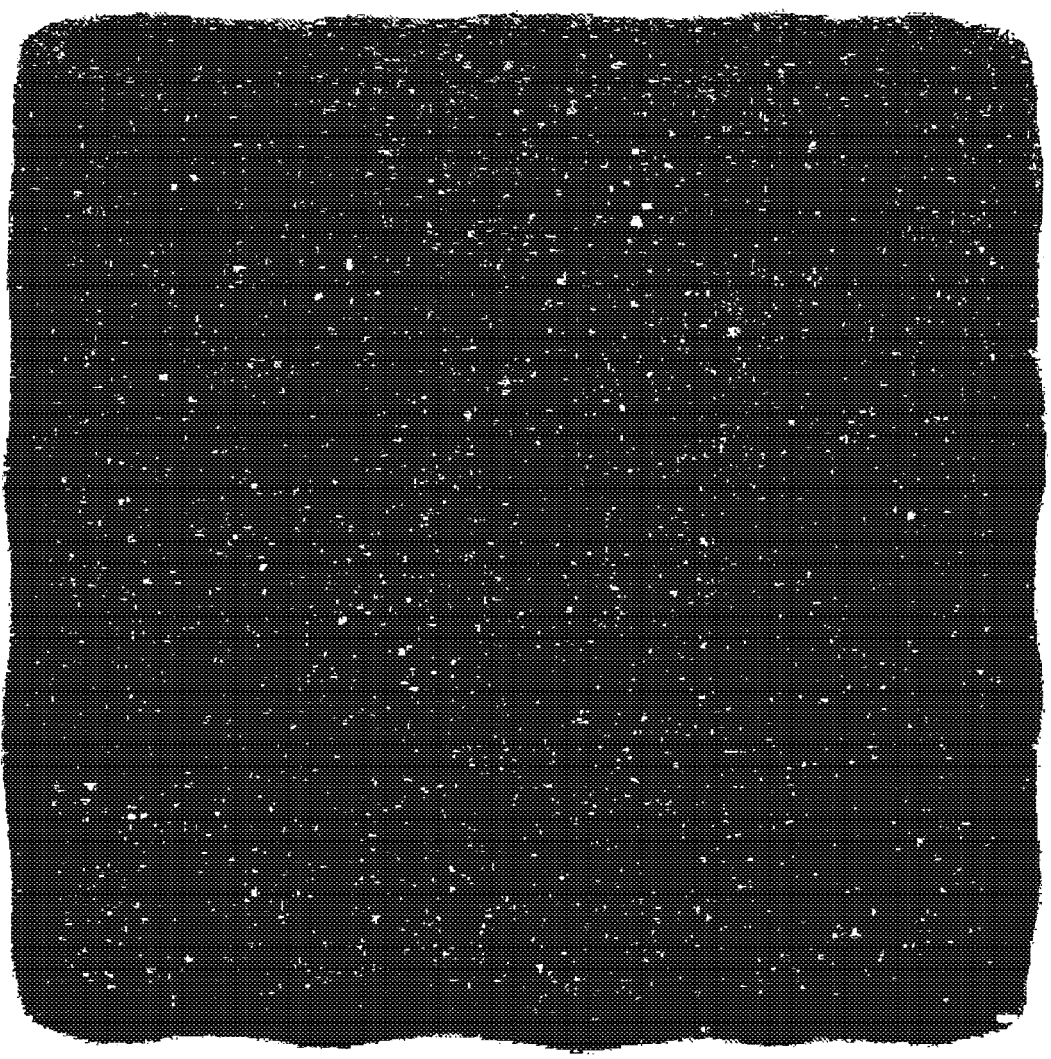
FIG. 32 is a top view of a conductive film before being irradiated with a laser.
Figure 33:
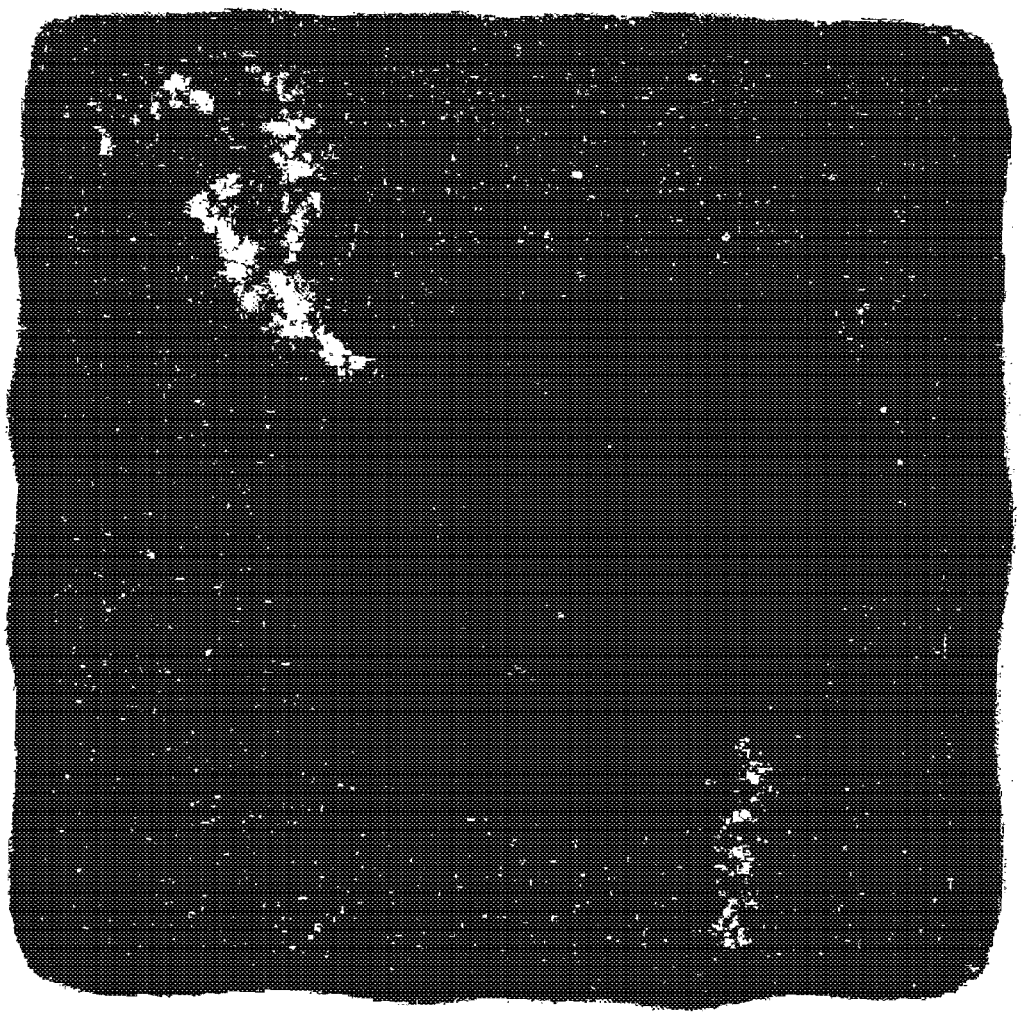
FIG. 33 is a top view of a conductive film after being irradiated with a laser.

An optical micrograph, which is taken from a top surface of a single conductive film 119 before laser irradiation for electrically connecting the conductive film 119 to the electrode 113, is shown in FIG. 32. An optical micrograph, which is taken from a top surface of the conductive film 119 after laser irradiation for electrically connecting the conductive film 119 to the electrode 113, is shown in FIG. 33. The optical micrographs shown in FIGS. 32 and 33 are taken at 50-fold magnification. A circular hole is formed as shown in FIG. 33. The conductive film 119 is electrically connected to the electrode 113 through this hole. Note that the hole for electrically connecting the conductive film 119 to the electrode 113 has the circular shape in FIG. 33; however, the shape of the hole is not limited to the circular shape. Further, there are portions that looks like cracks in FIG. 33; however, these portions had been contacted with a probe when measuring resistance, and the portions of the surface of the conductive film 119 where had been contacted with the probe, is rubbed and becomes metallic.

Note that an example where the output of the laser is adjusted such that the conductive films 119 are moved to reach the electrodes 113 and stopped at the electrodes 113, is shown here. Alternatively, the output of the laser may be adjusted such that holes passing through the resin film 114 and the first film 117 are formed.

Figure 4C:
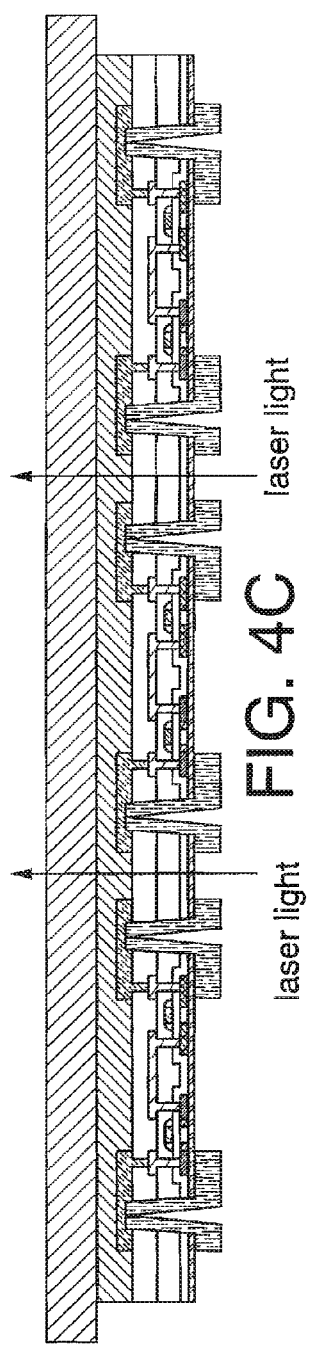
Figure 5:
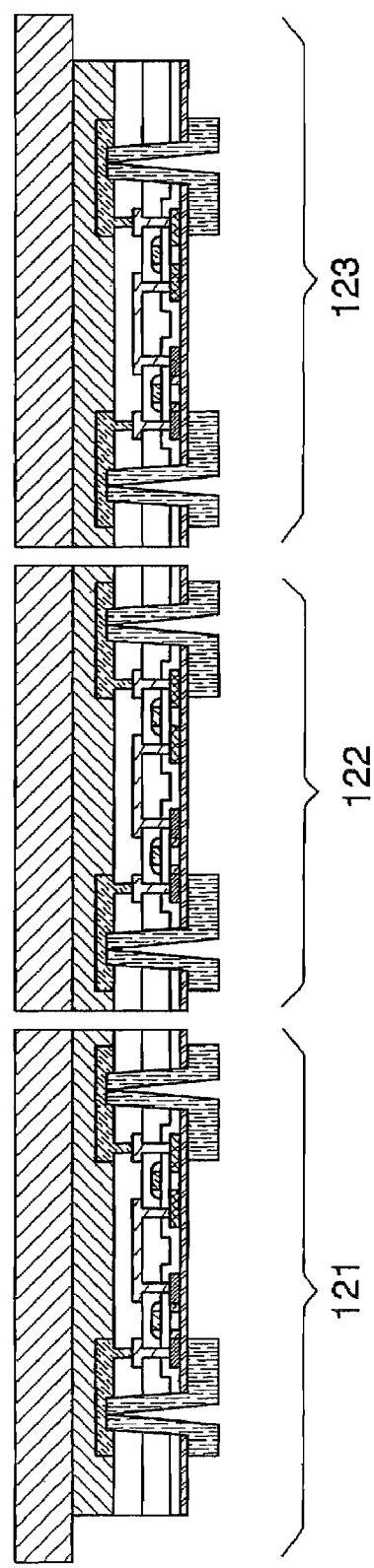
FIG. 5 is a cross sectional view explaining Embodiment Mode 1.

By irradiating each portion between the adjacent circuits 103 having the thin film transistors with laser beams as shown in FIG. 4C, the circuits 103 having the thin film transistors are individually divided into three portions 121, 122, and 123 each including a single circuit 103 having the thin film transistors. The divided portions 121, 122, and 123 become integrated circuit devices, respectively.

An example where the three circuits 103 having the thin film transistors are formed over the substrate is described in this embodiment mode; however, the number of the circuits 103 having the thin film transistors provided over the substrate is not limited thereto. It goes without saying that the number of the circuit 103 having the thin film transistors may be one, two, or three or more.

As described above, integrated circuit devices of the present invention are formed. A step of forming a semiconductor device by mounting an integrated circuit device of the present invention obtained above over a substrate, over which an antenna is formed, will be described below.

As shown in FIG. 24A, a conductive film 723 having a function of an antenna is formed over a substrate 722. An integrated circuit device 726 is attached to a surface of the substrate 722 by using a resin 724 containing conductive particles 725. By attaching the integrated circuit device 726 and the substrate 722 to each other using the resin 724 containing the conductive particles 725, connection portions of the conductive film 723 having the function of the antenna are electrically connected to connection conductive films provided at a back surface of the integrated circuit device 726 through the conductive particles 725.

Then, heat treatment is performed to cure the resin 724 containing the conductive particles 725. When using a heat separating film as the first film 117, the first film 117 can be separated from the resin film 114 by this heat treatment. A state after separating the first film 117 from the resin film 114 is shown in FIG. 24B.

As described above, the integrated circuit device of the present invention can be mounted over the substrate over which the antenna is formed. Note that a case where the conductive film having the function of the antenna and the integrated circuit device are electrically connected to each other by using the resin containing the conductive particles is described here. Alternatively, as a material for electrically connecting the conductive film having the function of the antenna to the integrated circuit device, a known material such as solder may be used, in addition to the resin containing the conductive particles.

In a case of using solder as a material for electrically connecting the conductive film having the function of the antenna to the integrated circuit device, heat treatment is also performed to melt the solder. Therefore, when using a heat separating film as the first film 117, the first film 117 can be separated from the resin film 114 by the heat treatment.

After mounting the integrated circuit device of the present invention over the substrate over which the antenna is formed, sealing is preferably performed. At least one surface of the substrate 722, over which the conductive film 723 having the function of the antenna is formed, may be sealed. A case where only one surface of the substrate 722, over which the conductive film 723 having the function of the antenna is formed, is sealed will be shown in FIG. 25A. When sealing is performed, the conductive film having the function of the antenna is sealed with a second film 729 having a structure in which an adhesive layer is provided over a base film. As the second film 729, a hot melt film can be given, for example. A hot melt film has a structure in which over a base film, an adhesive layer made from a resin having a softening point, which is lower than that of the base film, is formed. As a material used for the base film, polyester, PET (polyethylene terephthalate), PEN (polyethylene naphthalate), and the like can be given. A polyethylene resin, polyester, EVA (ethylene vinyl acetate), and the like can be given as a material used for the adhesive layer.

Further, as shown in FIG. 25B, the substrate 722 over which the antenna is formed may be sealed with two films (a second film 727 and a third film 728). As the second film 727 and the third film 728 shown in FIG. 25B, films each having a structure in which an adhesive layer is formed over a base film, may be used.

A case where after separating the first film 117 at the time of heat treatment, the substrate 722 over which the antenna is formed is sealed is described in FIGS. 24A and 24B and FIGS. 25A and 25B Alternatively, the substrate 722 over which the antenna is formed can be sealed while the first film 117 is attached to the surface of the resin film 114 without separating the first film 117. In this case, a film other than a heat separating film (such as a hot melt film) can be used.

Each of the integrated circuit devices formed in this embodiment mode has a resin film over the circuit having the thin film transistors and the electrode for electrically connecting to an external portion is provided adjacent to a back surface of the circuit having the thin film transistors. That is, the conductive film being electrically connected to the circuit having the thin film transistors is provided over a surface of the integrated circuit device, over which the resin film is not formed. Since the total thickness of the first insulating film and the layer including the circuit having the thin film transistors is about 10 μm or less and a thickness of the resin film is about 20 to 30 μm, by forming the conductive film being electrically connected to the circuit having the thin film transistors over the surface of the integrated circuit device over which the resin film is not formed, the conductive film being electrically connected to the circuit having the thin film transistors can be easily formed as compared to forming it over the resin film side.

Embodiment Mode 2

Although a case where the circuits having the thin film transistors are formed as thin film circuits is described in Embodiment Mode 1, a case of forming a circuit having a resistor as a thin film circuit will be described in this embodiment mode. Further, although the circuits having the thin film transistors are formed as the thin film circuits in Embodiment Mode 1 and a resistor will be formed as a thin film circuit in this embodiment mode, a case where a circuit having plural kinds of elements selected from a thin film transistor, a resistor, an inductor, and a capacitor can be implemented in accordance with the present invention.

Figure 6A:
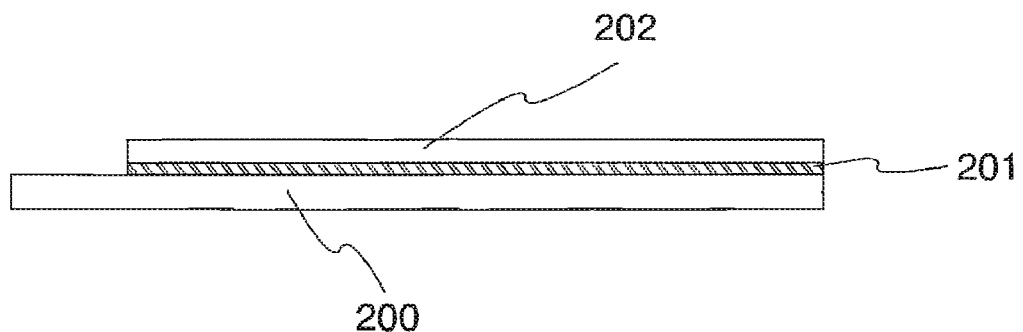
FIGS. 6A to 6D are cross sectional views explaining Embodiment Mode 2.

As shown in FIG. 6A, a separation layer 201 is formed over a substrate 200, and a first insulating film 202 is formed over the separation layer 201. The substrate 200 and the separation layer 201 may be formed using the same materials and the same methods described in Embodiment Mode 1, respectively.

Figure 6B:
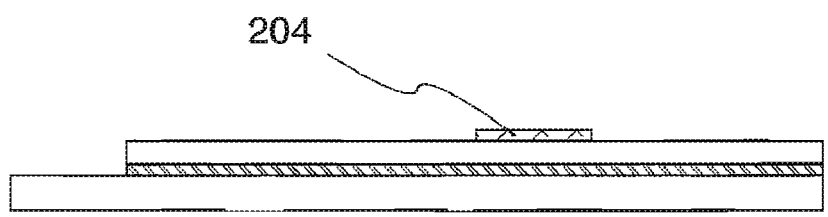
Figure 10A:
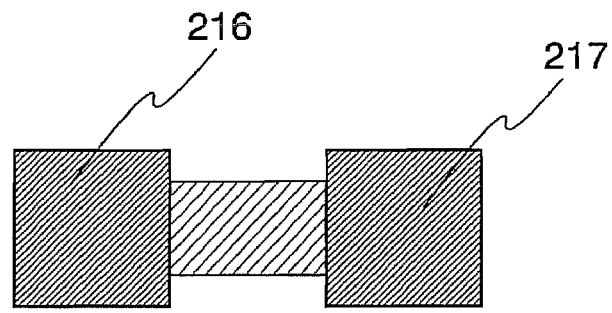
FIGS. 10A and 10B are diagrams explaining Embodiment Mode 2.
Figure 10B:
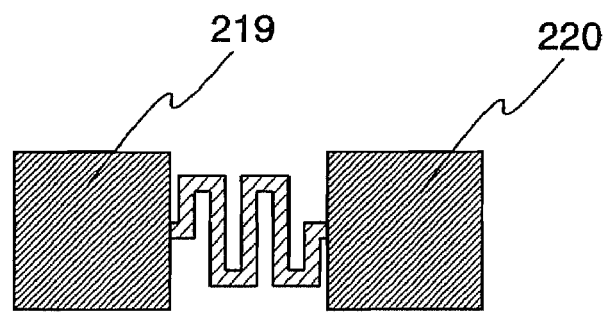

Next, as shown in FIG. 6B, a resistive element 204 is formed over the first insulating film 202. The resistive element 204 may be formed using $Ta_2N$, for example. Examples of a shape of the resistive element 204 seen from its top surface are shown in FIGS. 10A and 10B. Note that a case of forming a resistive element having the shape shown in FIG. 10A as the resistive element 204 will be described below.

Figure 6C:
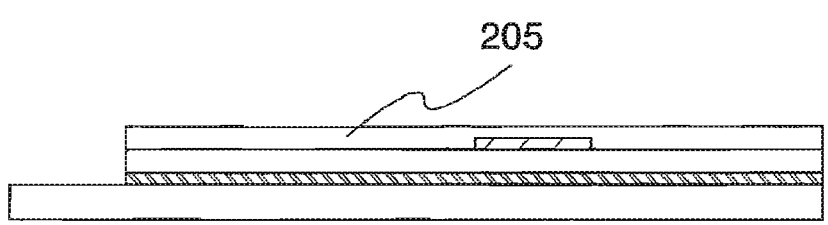
Figure 6D:
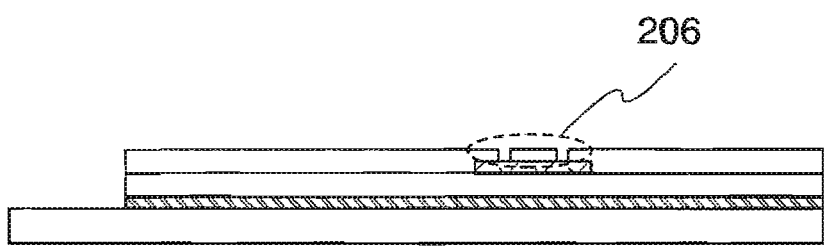

After forming the resistive element 204, a second insulating film 205 is formed over the resistive element 204 as shown in FIG. 6C. Then, openings 206 are formed in the second insulating film 205 as shown in FIG. 6D. The openings 206 are holes through which the resistive element 204 is contacted to electrodes, which will be formed later. The openings 206 are formed over regions 216 and 217 shown in FIG. 10A. In a case where a resistive element having the shape shown in FIG. 10B is formed, the openings 206 may be formed over regions 219 and 220 of FIG. 10B.

Figure 7A:
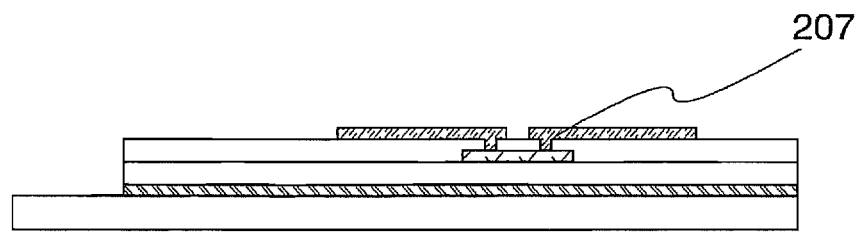
FIGS. 7A to 7D are cross sectional views explaining Embodiment Mode 2.

After forming the openings 206, electrodes 207 being electrically connected to the resistive element 204 are formed over the second insulating film 205 as shown in FIG. 7A. The electrodes 207 are formed to be electrically connected to the regions 216 and 217 of FIG. 10A, respectively.

Figure 7B:
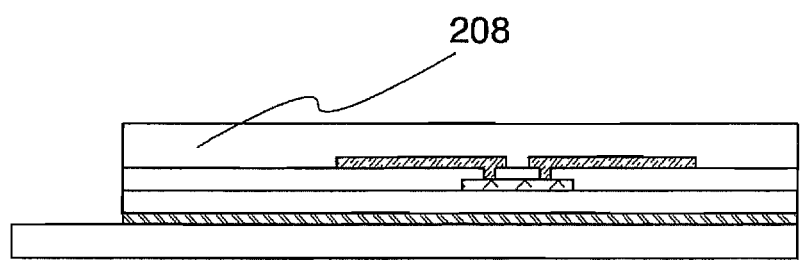
Figure 7C:
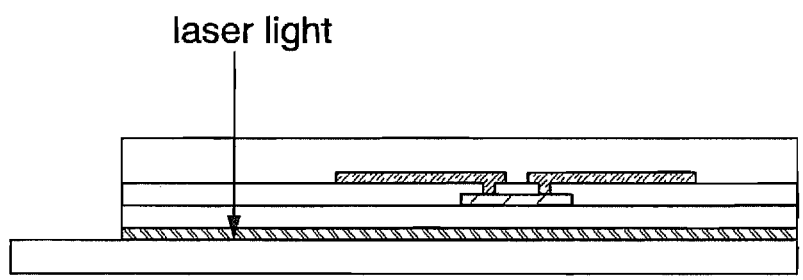
Figure 7D:
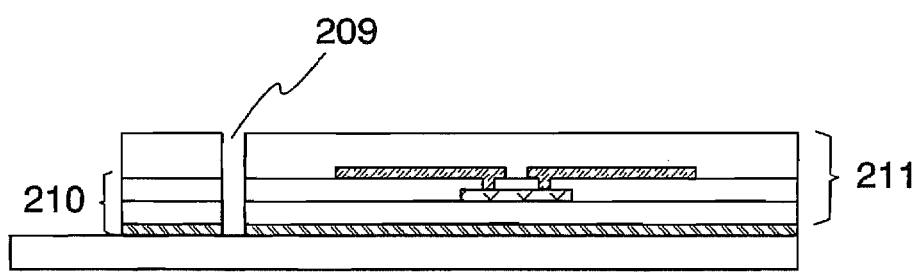

After forming the electrodes 207, a resin film 208 is formed over the electrodes 207 as shown in FIG. 7B. Thereafter, laser irradiation is performed as shown in FIG. 7C. An opening 209 is formed in the separation layer 201, the first insulating film 202, the second insulating film 205, and the resin film 208, as shown in FIG. 7D. By providing the opening 209, the separation layer 201 is partly removed so that a stacked body 211 including a layer 210 including a resistor, in which the first insulating film 202, the resistive element 204, the second insulating film 205, and the electrodes 207 are stacked, and the resin film 208 can be easily separated from the substrate 200. This separation is performed at a boundary between an interior portion of the separation layer 201 or the separation layer 201 and the first insulating film 202.

Further, any type of a laser can be used as well as Embodiment Mode 1. Laser irradiation conditions such as a frequency, power density, energy density, and a beam profile are arbitrarily controlled in consideration of thicknesses, materials and the like of the layer 210 including the resistor and the resin film 208.

Figure 8A:
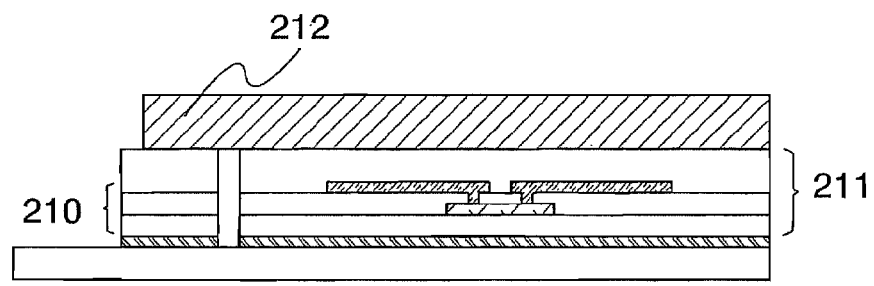
FIGS. 8A to 8D are cross sectional views explaining Embodiment Mode 2.
Figure 8B:
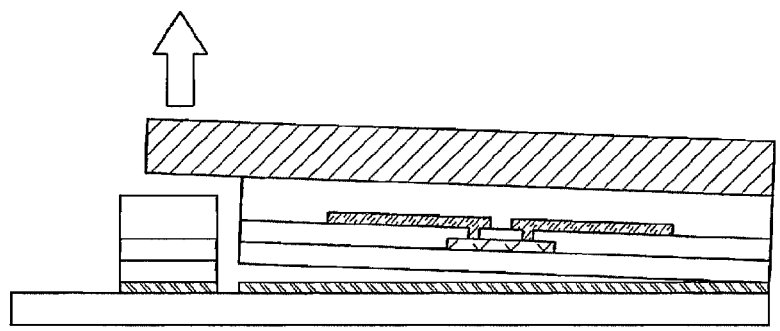

In order to separate the stacked body 211 including the layer 210 including the resistor and the resin film 208 from the substrate 200, a first film 212 is attached to a surface of the resin film 208 as shown in FIG. 8A and the first film 212 is pulled in a direction of an arrow as shown in FIG. 8B, and thus the stacked body 211 including the layer 210 including the resistor and the resin film 208 is separated from the substrate 200. In this case, the substrate 200 and the stacked body 211 are separated from each other at a boundary between the interior portion of the separation layer 201 or the separation layer 201 and the first insulating film 202. In the stacked body 211 separated from the substrate 200, the first insulating film 202 becomes an outermost surface. The resin film 208 secures strength when separating the substrate 200 and the stacked body 211 from each other by pulling the first film 212. The stacked body 211 can be prevented from breaking in this step by the resin film 208.

The first film 212 has a structure in which an adhesive layer is provided on a base film made from a resin material. For example, a hot melt film, a UV (ultraviolet) separating film, a heat separating film, and the like can be given. As a material used for the base film, polyester, PET (polyethylene terephthalate), PEN (polyethylene naphthalate), and the like can be given.

A hot melt film has a structure in which over a base film, an adhesive layer made from a resin having a softening point, which is lower than that of the base film, is formed. A polyethylene resin, polyester, EVA (ethylene vinyl acetate), and the like can be given as a material used for the adhesive layer. A UV (ultraviolet) separating film has a structure in which an adhesive layer made from a resin material whose adhesion is weakened by being irradiated with a UV (ultraviolet) ray, is formed over a base film. Further, a heat separating film has a structure in which an adhesive layer made from a resin material whose adhesion is weakened by heating is formed over a base film.

When a UV (ultraviolet) separating film is used as the first film 212, the first film 212 can be separated by being irradiated with UV (ultraviolet) ray after the separating step.

Further, when a heat separating film is used as the first film 212, the first film 212 can be separated by heating after the separating step.

Figure 8C:
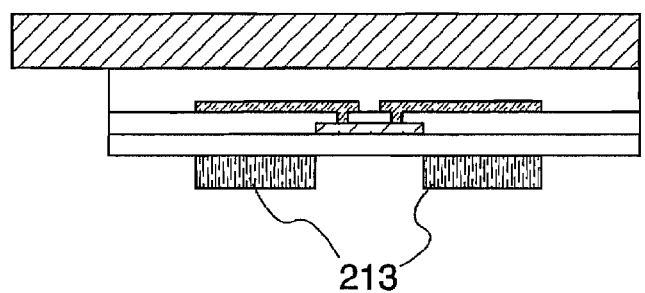

Then, as shown in FIG. 8C, conductive films 213 each having a thickness of 1 μm to several tens of μm, and preferably, 10 μm to 20 μm, are formed over a surface of the first insulating film 202 (a back surface of the thin film circuit), i.e., the surface of the first insulating film 202 over which the layer 210 including the circuit having the resistor is not formed, such that the conductive films are overlapped with the electrodes 207. The conductive films 213 may be formed using a conductive material such as an Au paste, an Ag paste, a Cu paste, an Ni paste, or an Al paste, solder, or the like by screen printing, for example. When each thickness of the conductive films 213 is 0.1 μm or less, the conductive films cannot be electrically connected to the electrodes 207 in a subsequent step because of their excessive thin thicknesses.

Figure 8D:
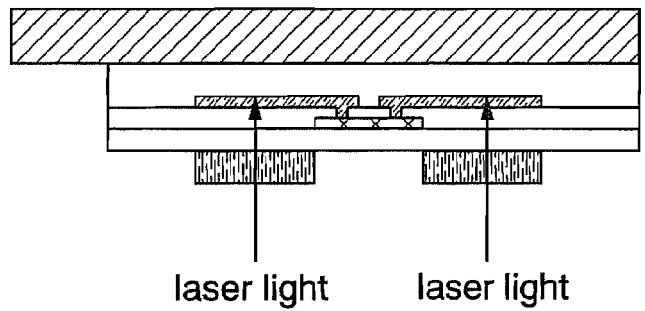
Figure 9:
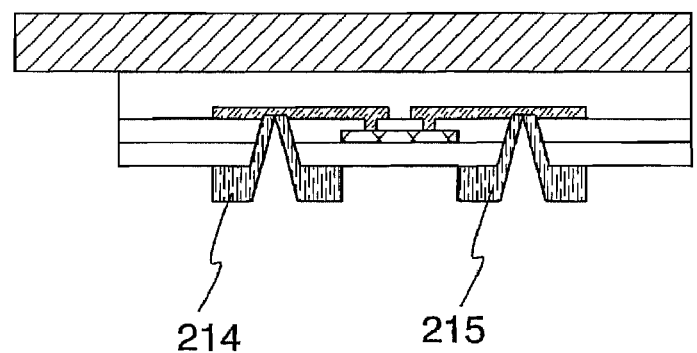
FIG. 9 is a cross sectional view explaining Embodiment Mode 2.

Then, as shown in FIG. 8D, the conductive films 213 are irradiated with laser beams. In this case, output of a laser is adjusted such that the conductive films 213 are moved to reach the electrodes 207 and the moved conductive films 213 are stopped at the electrodes 207. In this case, laser irradiation is performed by using an $Nd:YVO_4$ pulse laser with a laser wavelength of 266 nm under conditions of an oscillation frequency of 15 kHz and an average output of 3 W. These conditions are typical conditions and the present invention is not limited thereto. The conductive films 213 and the electrodes 207 are electrically connected to one another by the laser irradiation, and hence, a state shown in FIG. 9 is obtained. In FIG. 9, reference numerals 214 and 215 indicate the conductive films being electrically connected to the electrodes 207.

As shown in FIG. 9, holes are formed in the first insulating film 202 and the second insulating film 205 at positions irradiated with laser beams, and a material of the conductive films 213 is moved inside the electrodes 207 along side walls of the holes; therefore, the conductive films 213 are electrically connected to the electrodes.

Note that an example where the output of the laser is adjusted such that the conductive films 213 are moved to reach the electrodes 207 and stopped at the electrodes 207, is shown here. Alternatively, the output of the laser may be adjusted such that holes passing through the resin film 208 and the first film 212 are formed.

Embodiment Mode 3

In this embodiment mode, a case of forming a circuit having an inductor as a thin film circuit will be described. Although a case of forming a circuit having one kind of an element is shown in this embodiment mode, a case where a circuit has plural kinds of elements selected from a thin film transistor, a resistor, an inductor, and a capacitor can also be implemented.

A manufacturing process of an integrated circuit device having an inductor will be described with reference to cross sectional views focusing on a portion where the inductor is formed.

Figure 11A:
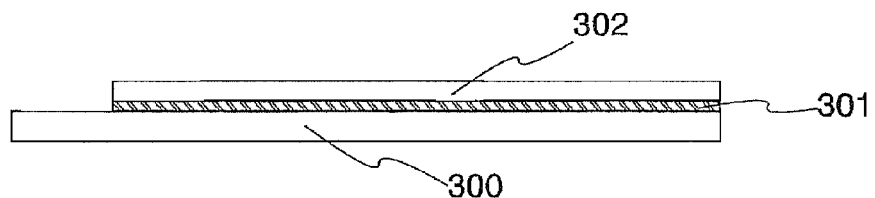
FIGS. 11A and 11C are cross sectional views and FIG. 11B is a cross section view and a top view explaining Embodiment Mode 3.

First, as shown in FIG. 11A, a separation layer 301 is formed over a substrate 300, and a first insulating film 302 is formed over the separation layer 301. The substrate 300 and the separation layer 301 may be formed using the same materials and the same formation methods described in Embodiment Mode 1.

Figure 11B:
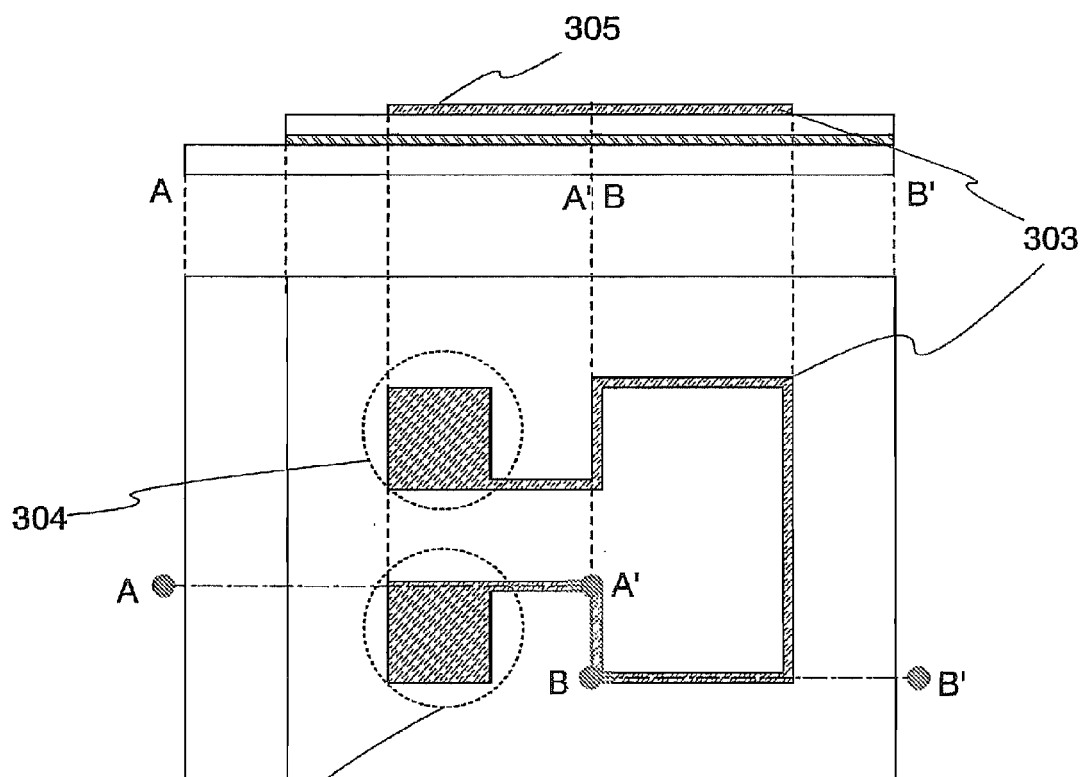

Next, as shown in FIG. 11B, a first conductive film 303 having a coiled shape is formed over the first insulating film 302. In FIG. 11B, an upper portion is a cross sectional view whereas a lower portion is a top view. In the top view of FIG. 11B, regions 304 and 305 are regions for contacting to electrodes, which will be formed later.

Figure 11C:
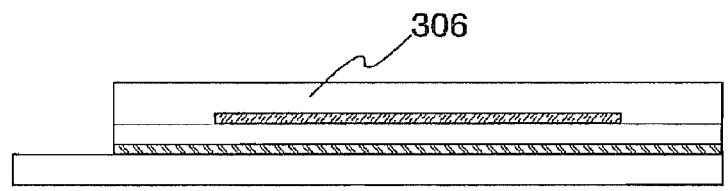
Figure 12A:
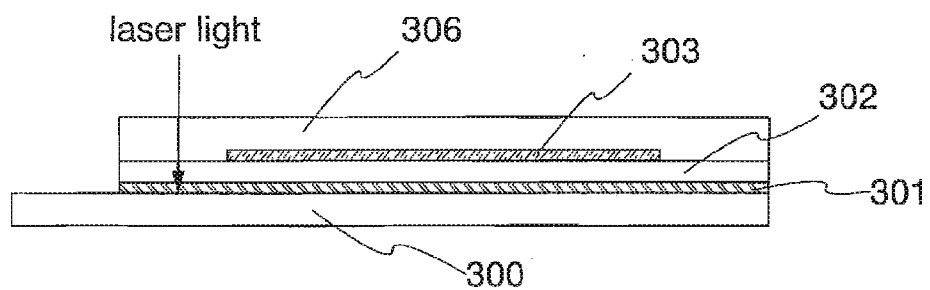
FIGS. 12A to 12D are cross sectional views explaining Embodiment Mode 3.
Figure 12B:
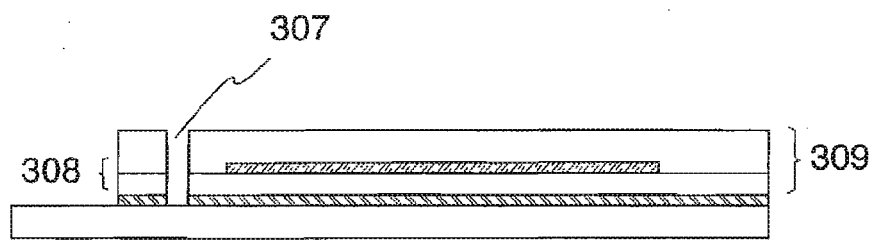

After forming the first conductive film 303, a resin film 306 is formed over the first conductive film 303 as shown in FIG. 11C. Then, the resin film 306 is irradiated with a laser beam as shown in FIG. 12A. An opening 307 is formed in the separation layer 301, the first insulating film 302, and the resin film 306 by laser irradiation, as shown in FIG. 12B. By forming the opening 307, the separation layer 301 is partly removed so that a stacked body 309 including a layer 308 including a circuit having the inductor, in which the first insulating film 302 and the first conductive film 303 are stacked, and the resin film 306 can be easily separated from the substrate 300. This separation is performed at a boundary between an interior portion of the separation layer 301 or the separation layer 301 and the first insulating film 302.

Further, any type of a laser can be used as well as Embodiment Mode 1. Laser irradiation conditions such as a frequency, power density, energy density, and a beam profile are arbitrarily controlled in consideration of thicknesses, materials and the like of the layer 308 including the circuit having the inductor and the resin film 306.

Figure 12C:
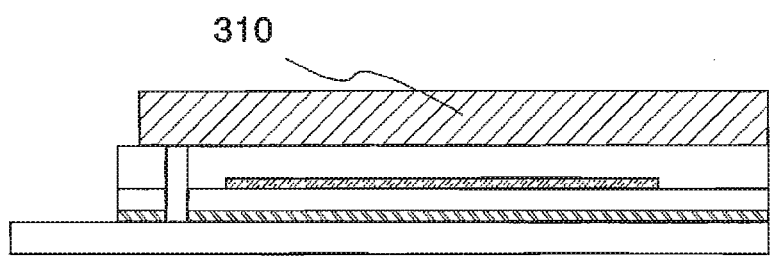
Figure 12D:
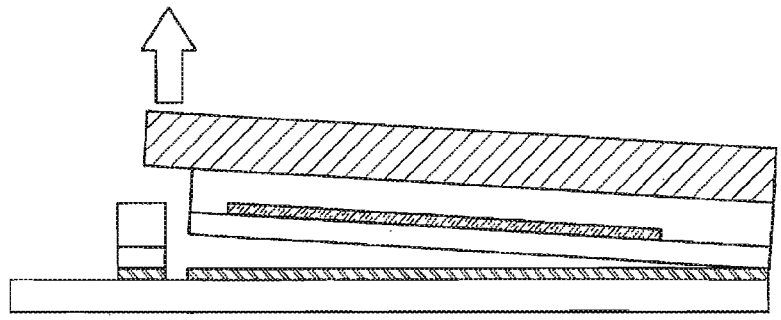
Figure 13A:
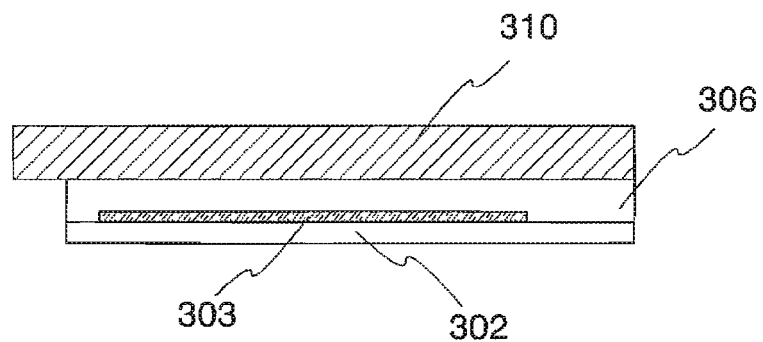
FIGS. 13A to 13D are cross sectional views explaining Embodiment Mode 3.

In order to separate the stacked body 309 including the layer 308 including the circuit having the inductor and the resin film 306 from the substrate 300, a first film 310 is attached to a surface of the resin film 306 as shown in FIG. 12C and the first film 310 is pulled in a direction of an arrow as shown in FIG. 12D; therefore, the stacked body 309 including the layer 308 including the circuit having the inductor and the resin film 306 is separated from the substrate 300. A state of the stacked body 309 and the first film 310 separated from the substrate 300 is shown in FIG. 13A. When the stacked body 309 is separated from the substrate 300, the substrate 300 and the stacked body 309 are separated from each other at a boundary between the interior portion of the separation layer 301 or the separation layer 301 and the first insulating film 302. In the stacked body 309 separated from the substrate 300, the first insulating film 302 becomes an outermost surface. The resin film 306 secures strength when separating the substrate 300 and the stacked body 309 from each other by pulling the first film 310. The stacked body 309 can be prevented from breaking in this step by the resin film 306.

The first film 310 has a structure in which an adhesive layer is provided on a base film made from a resin material. For example, a hot melt film, a UV (ultraviolet) separating film, a heat separating film, and the like can be given. As a material used for the base film, polyester, PET (polyethylene terephthalate), PEN (polyethylene naphthalate), and the like can be given.

A hot melt film has a structure in which over a base film, an adhesive layer made from a resin having a softening point, which is lower than that of the base film, is formed. A polyethylene resin, polyester, EVA (ethylene vinyl acetate), and the like can be given as a material for the adhesive layer. A UV (ultraviolet) separating film has a structure in which an adhesive layer made from a resin material, whose adhesion is weakened by being irradiated with a UV (ultraviolet) ray, is formed over a base film. A heat separating film has a structure in which an adhesive layer made from a resin material whose adhesion is weakened by heating is formed over a base film.

When a UV (ultraviolet) separating film is used as the first film 310, the first film 310 can be separated by being irradiated with UV (ultraviolet) ray after the separating step.

Further, when a heat separating film is used as the first film 310, the first film 310 can be separated by heating after the separating step.

Figure 13B:
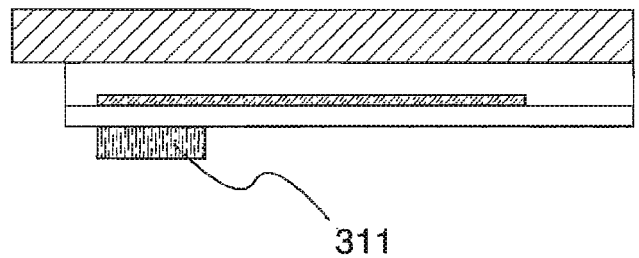

Then, as shown in FIG. 13B, second conductive films 311 each having a thickness of 1 μm to several tens of μm, and preferably, 10 μm to 20 μm, are formed over a surface of the first insulating film 302 (a back surface of a thin film circuit), i.e., the surface of the first insulating film 302 over which the layer 308 including the circuit having the inductor is not formed, such that the second conductive films are overlapped with the regions 304 and 305 of the first conductive film 303, respectively. The second conductive films 311 may be formed using a conductive material such as an Au paste, an Ag paste, a Cu paste, an Ni paste, or an Al paste, solder, or the like by screen printing, for example. When the thickness of each of the second conductive films 311 is 0.1 μm or less, the second conductive films cannot be electrically connected to the first conductive film 303 in a subsequent step because of their excessive thin thickness.

FIG. 13B is a cross sectional view along a line A-A' of the top surface shown in FIG. 11B. Only a single second conductive film 311, which is formed at a position overlapping with the region 305 of the first conductive film 303 shown in FIG. 11B, is shown in FIG. 13B; however, other second conductive film is also formed at a position overlapping with the region 304 of the first conductive film 303.

Figure 13C:
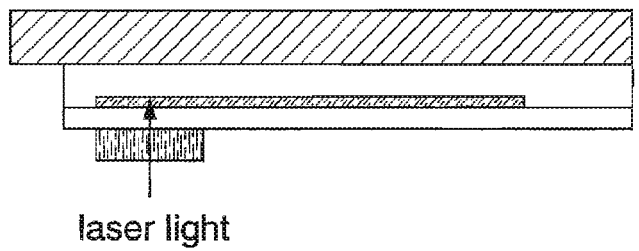
Figure 13D:
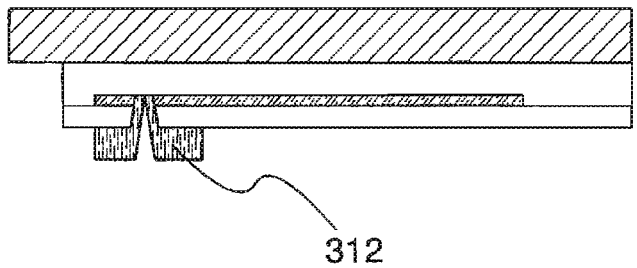

Then, as shown in FIG. 13C, the second conductive film 311 is irradiated with laser beams. In this case, output of a laser is adjusted such that the second conductive film 311 is moved to reach the first conductive film 303 and the moved second conductive film 311 is stopped at the first conductive film 303. Laser irradiation is performed by using an Nd:YVO$_4$ pulse laser with a laser wavelength of 266 nm under conditions of an oscillation frequency of 15 kHz and an average output of 3 W. These conditions are typical conditions and the present invention is not limited thereto. The second conductive film 311 and the first conductive film 303 are electrically connected to each other by the laser irradiation, and hence, a state shown in FIG. 13D is obtained. In FIG. 13D, reference numeral 312 indicates the second conductive film being electrically connected to the first conductive film 303.

As shown in FIG. 13D, a hole is formed in the first insulating film 302 at a position irradiated with the laser beam, and a material of the second conductive film 311 is moved inside the first conductive film 303 along a side wall of the hole; therefore, the second conductive film 311 is electrically connected to the first conductive film.

Note that an example where the output of the laser is adjusted such that the second conductive film 311 is moved to reach the first conductive film 303 and stopped at the first conductive film 303, is shown here. Alternatively, the output of the laser may be adjusted such that a hole passing through the resin film 306 and the first film 310 is formed.

Embodiment Mode 4

A method for forming an integrated circuit device having a capacitor as a thin film circuit will be described in this embodiment mode. Although a case of forming a circuit having one kind of an element will be described in this embodiment mode, a case of a circuit having plural kinds of elements selected from a thin film transistor, a resistor, an inductor, and a capacitor, can also be implemented.

Figure 14A:
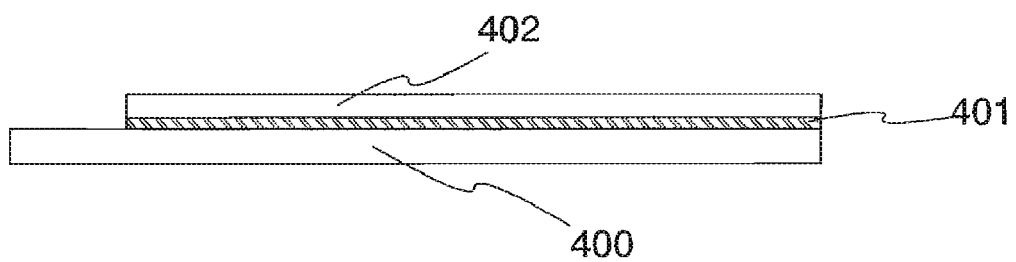
FIGS. 14A to 14D are cross sectional views explaining Embodiment Mode 4.

First, as shown in FIG. 14A, a separation layer 401 is formed over a substrate 400, and a first insulating film 402 is formed over the separation layer 401. The substrate 400 and the separation layer 401 may be formed using the same materials and the same formation methods as described in Embodiment Mode 1.

Figure 14B:
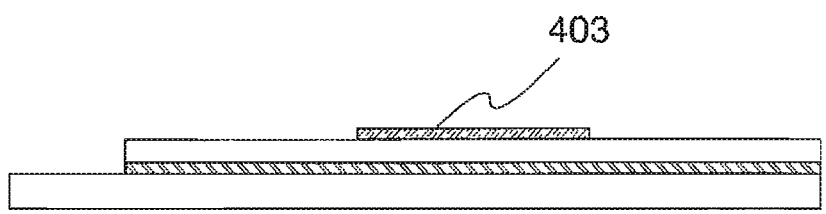
Figure 14C:
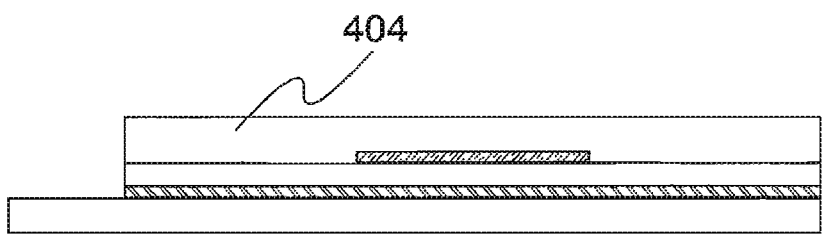

Next, as shown in FIG. 14B, a first electrode 403 of a capacitor is formed over the first insulating film 402. A metal film or the like may be formed as the first electrode 403 of the capacitor, for example. Next, a second insulating film 404 is formed as shown in FIG. 14C. The second insulating film 404 may be formed using a dielectric substance such as TiO$_2$, Al$_2$O$_3$, BaTiO$_3$, or SiO$_2$.

Figure 14D:
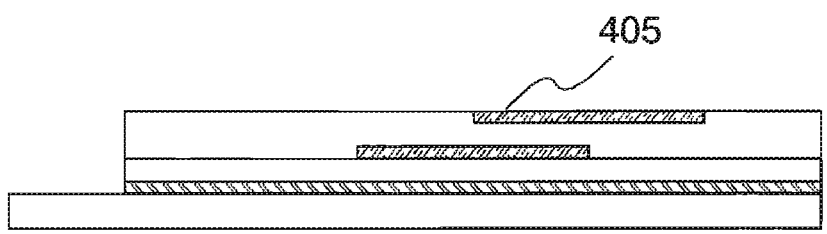

Then, as shown in FIG. 14D, a second electrode 405 of the capacitor is formed. The second electrode 405 of the capacitor may be formed using a metal film or the like as well as the first electrode of the capacitor. Thus, the capacitor including the first electrode, the insulating film, and the second electrode is formed.

Figure 15A:
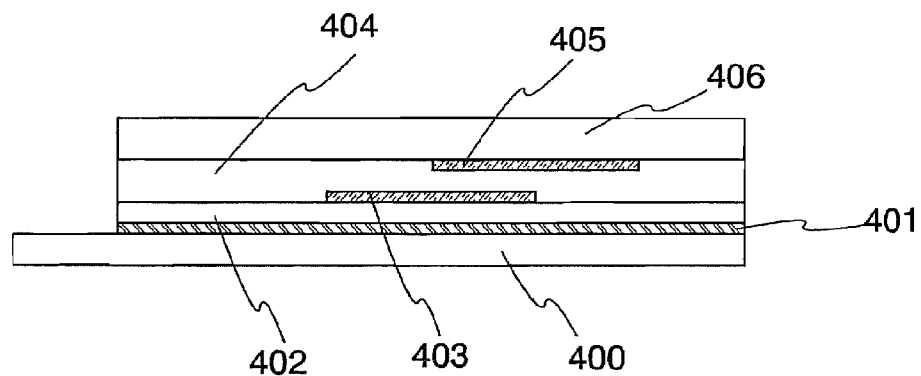
FIGS. 15A to 15D are cross sectional views explaining Embodiment Mode 4.
Figure 15B:
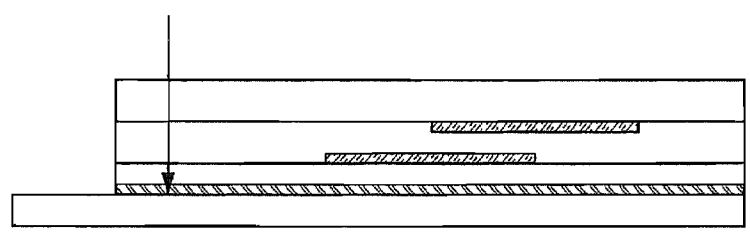
Figure 15C:
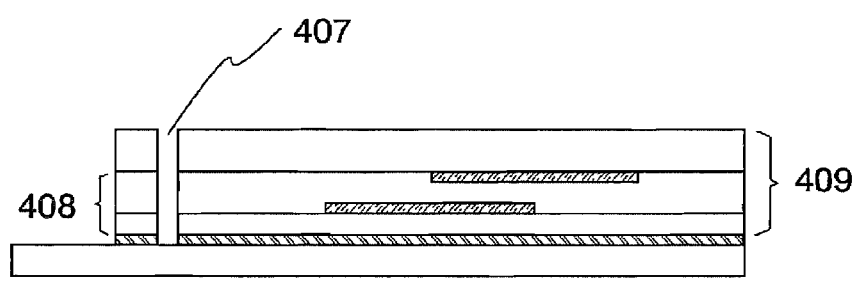

Subsequently, a resin film 406 is formed over the capacitor manufactured above as shown in FIG. 15A. The resin film 406 is provided for securing strength of the thin film circuit. After forming the resin film 406, laser irradiation is performed as shown in FIG. 15B. By the laser irradiation, an opening 407 is formed in the separation layer 401, the first insulating film 402, the second insulating film 404, and the resin film 406 as shown in FIG. 15C. By forming the opening 407, the separation layer 401 is partly removed so that a stacked body 409 including a layer 408 including a circuit having the capacitor, in which the first insulating film 402, the first electrode 403, the second insulating film 404, and the second electrode 405 are stacked, and the resin film 406 can be easily separated from the substrate 400. This separation is performed at a boundary between an interior portion of the separation layer 401 or the separation layer 401 and the first insulating film 402.

Further, any type of a laser can be used as well as Embodiment Mode 1. Laser irradiation conditions such as a frequency, power density, energy density, and a beam profile are arbitrarily controlled in consideration of thicknesses, materials and the like of the layer 408 including the circuit having the capacitor and the resin film 406.

Figure 15D:
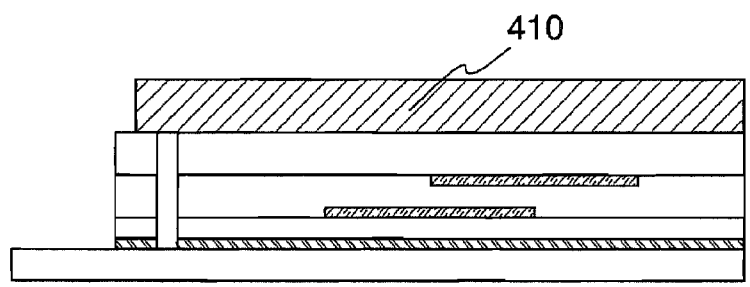
Figure 16A:
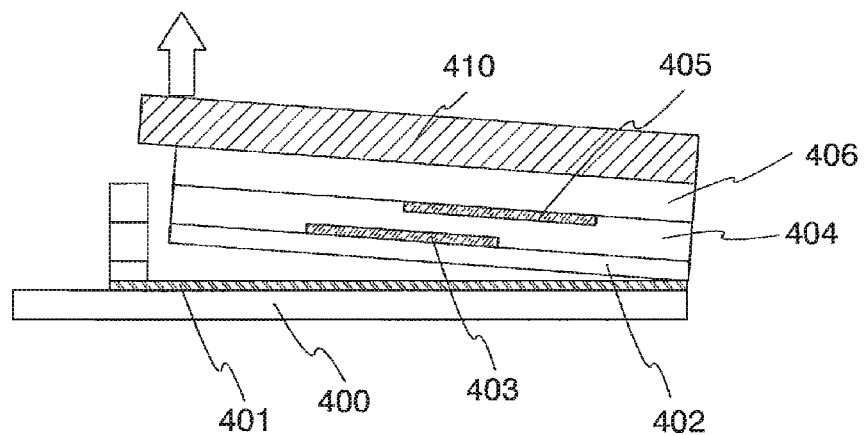
FIGS. 16A to 16D are cross sectional views explaining Embodiment Mode 4.
Figure 16B:
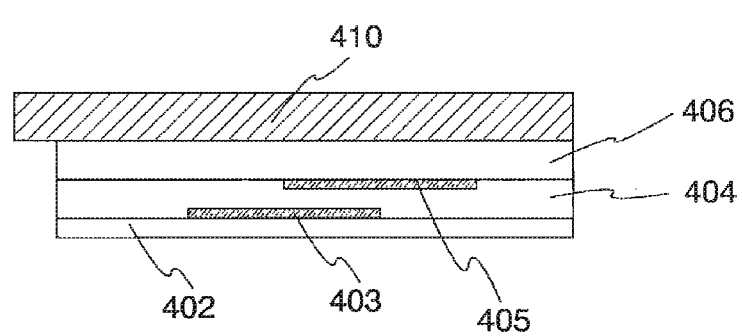

In order to separate the stacked body 409 including the layer 408 including the circuit having the capacitor and the resin film 406 from the substrate 400, a first film 410 is attached to a surface of the resin film 406 as shown in FIG. 15D and the first film 410 is pulled in a direction of an arrow as shown in FIG. 16A; therefore, the stacked body 409 including the layer 408 including the circuit having the capacitor and the resin film 406 is separated from the substrate 400. A state of the stacked body 409 and the first film 410 separated from the substrate 400 is shown in FIG. 16B. When the stacked body 409 is separated from the substrate 400, the substrate 400 and the stacked body 409 are separated from each other at a boundary between the interior portion of the separation layer 401 or the separation layer 401 and the first insulating film 402. In the stacked body 409 separated from the substrate 400, the first insulating film 402 becomes an outermost surface. The resin film 406 secures strength when separating the substrate 400 and the stacked body 409 from each other by pulling the first film 410. The stacked body 409 can be prevented from breaking in this step by the resin film 406.

The first film 410 has a structure in which an adhesive layer is provided over a base film made from a resin material. For example, a hot melt film, a UV (ultraviolet) separating film, a heat separating film, and the like can be given. As a material used for the base film, polyester, PET (polyethylene terephthalate), PEN (polyethylene naphthalate), and the like can be given.

A hot melt film has a structure in which over a base film, an adhesive layer made from a resin having a softening point, which is lower than that of the base film, is formed. A polyethylene resin, polyester, EVA (ethylene vinyl acetate), and the like can be given as a material used for the adhesive layer. A UV (ultraviolet) separating film has a structure in which an adhesive layer made from a resin material whose adhesion is weakened by being irradiated with a UV (ultraviolet) ray, is formed over a base film. A heat separating film has a structure in which an adhesive layer made from a resin material whose adhesion is weakened by heating is formed over a base film.

When a UV (ultraviolet) separating film is used as the first film 410, the first film 410 can be separated by being irradiated with UV (ultraviolet) ray after the separating step.

Further, when a heat separating film is used as the first film 410, the first film 410 can be separated by heating after the separating step.

Figure 16C:
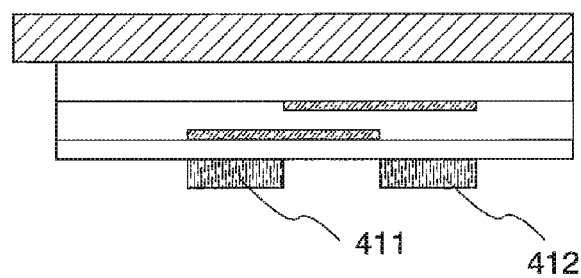

Then, as shown in FIG. 16C, conductive films 411 and 412 each having a thickness of 1 μm to several tens of μm, and preferably, 10 μm to 20 μm, are formed over a surface of the first insulating film 402 (a back surface of a thin film circuit), i.e., the surface of the first insulating film 402 over which the layer 408 including the circuit having the capacitor is not formed, such that the conductive films are overlapped with part of the first electrode 403 and part of the second electrode 405, respectively. The conductive films 411 and 412 may be formed using a conductive material such as an Au paste, an Ag paste, a Cu paste, an Ni paste, or an Al paste, solder, or the like by screen printing, for example. When a thickness of each of the conductive films 411 and 412 is 0.1 μm or less, the conductive films cannot be electrically connected to the first electrode 403 and the second electrode 405 in a subsequent step because of their excessive thin thicknesses.

Figure 16D:
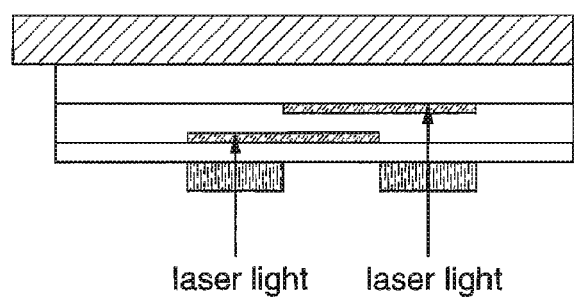
Figure 17:
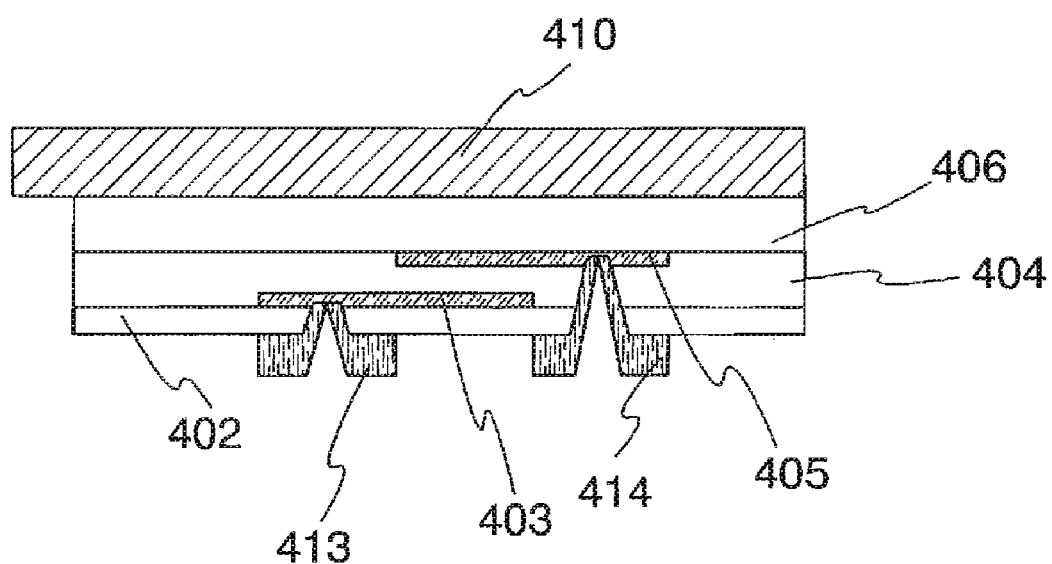
FIG. 17 is a cross sectional view explaining Embodiment Mode 4.

Then, as shown in FIG. 16D, the conductive films 411 and 412 are irradiated with laser beams. Output of a laser is adjusted such that the conductive film 411 is moved to reach the first electrode 403, and the moved conductive film 411 is stopped at the first electrode 403. Further, output of the laser is adjusted such that the conductive film 412 is moved to reach the second electrode 405, and the moved conductive film 412 is stopped at the second electrode 405. In this case, laser irradiation is performed by using an Nd:YVO$_4$ pulse laser with a laser wavelength of 266 nm under conditions of an oscillation frequency of 15 kHz and an average output of 3 W. These conditions are typical conditions and the present invention is not limited thereto. The conductive film 411 and the first electrode 403 are electrically connected to each other and the conductive film 412 and the second electrode 405 are electrically connected to each other by the laser irradiations, and hence, a state shown in FIG. 17 is obtained. In FIG. 17, reference numeral 413 indicates the conductive film being electrically connected to the first electrode 403 and reference numeral 414 indicates the conductive film being electrically connected to the second electrode 405.

As shown in FIG. 17, a hole is formed in the first insulating film 402 at a position irradiated with the laser beam for forming the conductive film 413 being electrically connected to the first electrode 403, and a material of the conductive film 413 is moved to the first electrode 403 along a side wall of the hole; therefore, the conductive film 413 is electrically connected to the first electrode. Further, a hole is formed in the first insulating film 402 and the second insulating film 404 at a position irradiated with the laser beam for forming the conductive film 414 being electrically connected to the second electrode 405, and a material of the conductive film 414 is moved to the second electrode 405 along a side wall of the hole; therefore, the conductive film 414 is electrically connected to the second electrode.

Note that an example where the output of the laser is adjusted such that the conductive film 411 is moved to reach the first electrode 403 and stopped at the first electrode 403 when forming the conductive film 413 being electrically connected to the first electrode 403 whereas the output of the laser is adjusted such that the conductive film 414 is moved to reach the second electrode 405 and stopped at the second electrode 405 when forming the conductive film 414 being electrically connected to the second electrode 405, is shown here. Alternatively, the output of the laser in forming the conductive film 413 being electrically connected to the first electrode and output of the laser in forming the conductive film 414 being electrically connected to the second electrode may be adjusted such that holes passing through the resin film 406 and the first film 410 are formed.

Embodiment Mode 5

A case in which a flexible integrated circuit device is formed by reducing a thickness of a substrate by grinding, polishing or the like will be described in this embodiment mode, though a case of forming a flexible integrated circuit device by separating a stacked body including a layer including a circuit having a thin film transistor from a substrate is described in Embodiment Mode 1. Although a case of forming a thin film transistor as a thin film circuit will be described in this embodiment mode, a case of a thin film circuit having one or plural kinds of elements selected from a thin film transistor, a resistor, an inductor, and a capacitor can also be implemented.

First, as shown in FIG. 18A, a first insulating film 501 is formed over a first substrate 500. This first insulating film serves as a base film. The first insulating film 501 is formed using silicon oxide, silicon nitride, silicon oxide containing nitrogen, silicon nitride containing oxygen, or the like by plasma CVD, sputtering, or the like.

As the first substrate 500, a quartz substrate, a semiconductor substrate, a glass substrate, a metal substrate, or the like may be used.

As shown in FIG. 18B, a layer 504 including circuits 503 having thin film transistors is formed over the first insulating film 501 by a known method. As the layer 504 including the circuits 503 having the thin film transistors, for example, a plurality of thin film transistors, a second insulating film 510 covering the plurality of thin film transistors, source or drain wirings 511 being in contact with the second insulating film 510 and connected to source or drain regions of the plurality of thin film transistors, are formed. Each of the plurality of thin film transistors includes an island-like semiconductor film 507, a gate insulating film 508, a gate electrode 509 provided with a sidewall, and the like. In FIG. 18B, a circuit including an N-channel thin film transistor 505 and a P-channel thin film transistor 506 is shown as an example of each of the circuits 503 having the thin film transistors; however, the present invention is not limited thereto. Further, an example where a top-gate thin film transistor having an LDD region (a low concentration impurity region) along with a gate electrode provided with a sidewall is formed as each of the N-channel thin film transistors 505 whereas a top-gate thin film transistor having a gate electrode provided with a sidewall is formed as each of the P-channel thin film transistors 506, is shown in FIG. 18B; however, the present invention is not limited thereto. A known structure of a thin film transistor such as a thin film transistor having no LDD region (no low concentration impurity region) or a bottom-gate thin film transistor is applicable.

Note that the circuits 503 having the thin film transistors can be formed using the manufacturing method described in Embodiment Mode 1.

Next, as shown in FIG. 18C, a third insulating film 512 is formed over the layer 504 including the circuits 503 having the thin film transistors, and electrodes 513 being electrically connected to wirings of the circuits 503 having the thin film transistors are formed over the third insulating film 512.

The third insulating film 512 is formed by a single layer or a stacked layer made from an inorganic material such as silicon oxide, silicon nitride, silicon oxynitride, or silicon nitride oxide; an organic material such as polyimide, polyamide, benzocyclobutene, acrylic, or epoxy; siloxane; or the like by a known method.

The electrodes 513 are formed to be electrically connected to the source or drain wirings of the thin film transistors in FIG. 18C; however, the present invention is not limited to this case. An electrode may be formed at a position to be electrically connected to an external circuit in a thin film circuit.

Figure 19A:
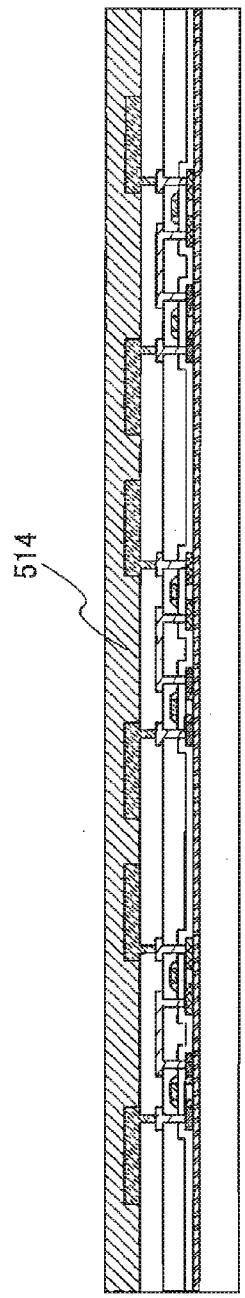
FIGS. 19A to 19C are cross sectional views explaining Embodiment Mode 5.

Next, as shown in FIG. 19A, a fourth insulating film 514 is formed over the electrodes 513. The fourth insulating film 514 is formed by a single layer or a stacked layer using an inorganic material such as silicon oxide, silicon nitride, silicon oxynitride, or silicon nitride oxide; an organic material such as polyimide, polyamide, benzocyclobutene, acrylic, or epoxy; siloxane; or the like by a known method.

Figure 19B:
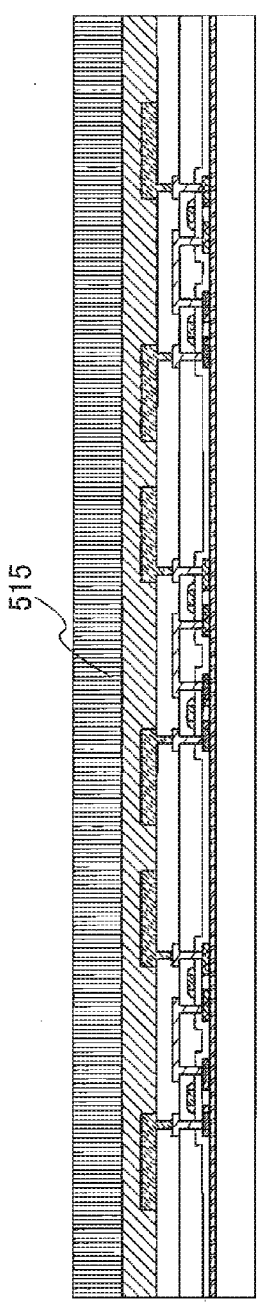

Then, as shown in FIG. 19B, a second substrate 515 is attached to a surface of the fourth insulating film 514 by using an adhesive material. As the second substrate 515, a quartz substrate, a semiconductor substrate, a glass substrate, a metal substrate, a resin substrate, or the like can be used. An adhesive material whose adhesion is weakened by heating is preferably used. In addition, a film having a structure where an adhesive layer is provided on a base film such as a hot melt film, a UV (ultraviolet) separating film, or a heat separating film may be used as the second substrate.

In a case where the second substrate 515 is not attached to the surface of the fourth insulating film 514, in a step of reducing a thickness of the first substrate 500, which will be performed later, as reducing the thickness of the first substrate 500, a stacked body including the layer 504 including the circuits having the thin film transistor, the third insulating film 512, the electrodes 513, and the fourth insulating film 514, may be curved. However, attaching the second substrate 515 to the surface of the fourth insulating film 514 makes it possible to prevent the stacked body including the layer 504 including the circuits having the thin film transistors, the third insulating film 512, the electrodes 513, and the fourth insulating film 514, from being curved in the step of reducing the thickness of the first substrate 500, which will be performed later.

Figure 19C:
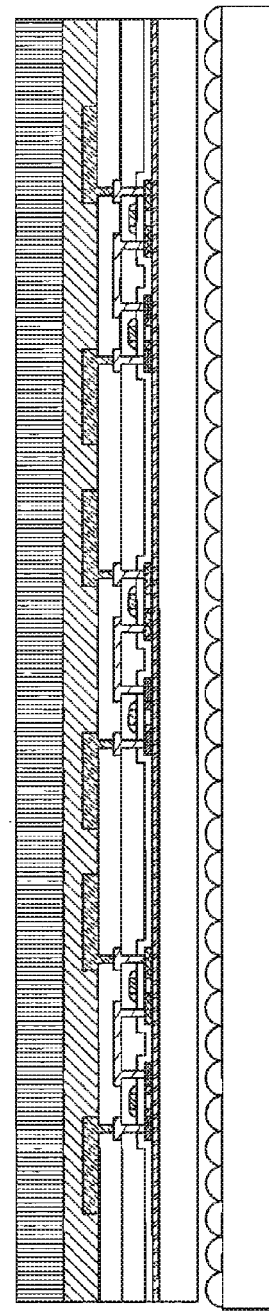

After attaching the second substrate to the surface of the fourth insulating film 514, treatment for reducing the thickness of the first substrate 500 is performed. By this treatment, the thickness of the first substrate 500 is reduced to be 100 μm or less, and preferably, 20 to 50 μm. The thickness of the first substrate 500 is reduced by using a grinding means or polishing means 516 here as shown in FIG. 19C. In this case, the thickness of the first substrate 500 may be reduced by grinding the substrate only using the grinding means. Alternatively, the thickness of the first substrate 500 may be reduced by polishing the substrate only using the polishing means. Preferably, after the first substrate is subjected to grinding by the grinding means, the substrate is polished by the polishing means.

As a means for reducing the thickness of the first substrate 500, the grinding means or polishing means is employed here; however, the present invention is not limited thereto. As a means for reducing the thickness of the first substrate 500, wet etching may be used. In this case, when a film being resistant to an etching solution, by which the first substrate 500 is etched, is formed between the first substrate 500 and the first insulating film 501, the first insulating film 501 can be prevented from being etched.

Figure 20A:
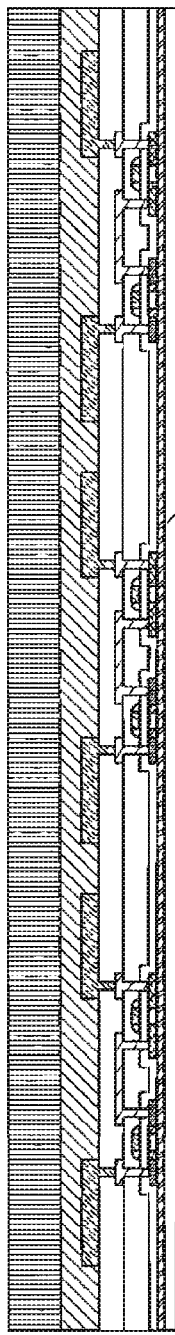
FIGS. 20A to 20C are cross sectional views explaining Embodiment Mode 5.

After performing the treatment for reducing the thickness of the first substrate 500, a state of the first substrate 500 having a reduced thickness is shown in FIG. 20A. FIG. 20A shows a state where part of the first substrate 500 remains; however, the first substrate 500 may be entirely removed or part of the first substrate 500 remains on the surface of the first insulating film 501.

Figure 20B:
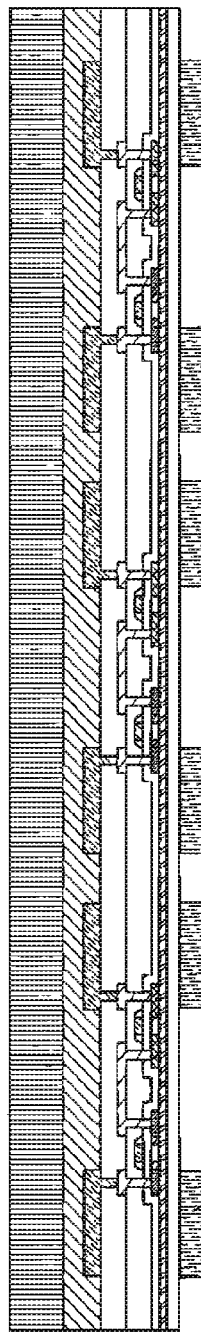

Then, as shown in FIG. 20B, conductive films 517 each having a thickness of 1 μm to several tens of μm, and preferably, 10 μm to 20 μm, are formed over a surface of the first substrate 500 over which the first insulating film 501 is not provided, i.e., a back surface of a thin film circuit, such that the conductive films are overlapped with the electrodes 513. The conductive films 517 may be formed using a conductive material such as an Au paste, an Ag paste, a Cu paste, an Ni paste, or an Al paste, solder, or the like by screen printing, for example. When a thickness of each of the conductive films 517 is 0.1 μm or less, the conductive films cannot be electrically connected to the electrodes 513 in a subsequent step because of their excessive thin thicknesses.

Figure 20C:
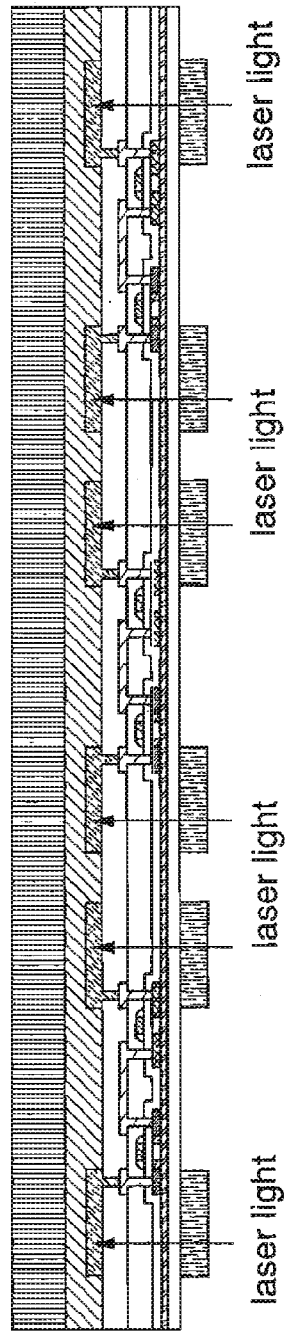
Figure 21A:
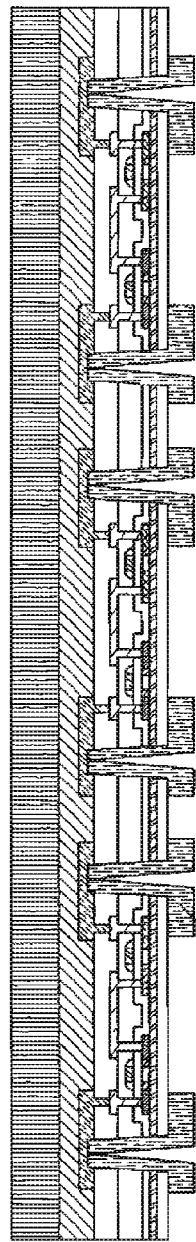
FIGS. 21A to 21C are cross sectional views explaining Embodiment Mode 5.

Then, as shown in FIG. 20C, the conductive films 517 are irradiated with laser beams. In this case, output of a laser is adjusted such that the conductive films 517 are moved to reach the electrodes 513 and the moved conductive films 517 are stopped at the electrodes 513. Laser irradiation is performed by using an Nd:YVO$_4$ pulse laser with a laser wavelength of 266 nm under conditions of an oscillation frequency of 15 kHz and an average output of 3 W. These conditions are typical conditions and the present invention is not limited thereto. The conductive films 517 and the electrodes 513 are electrically connected to one another by the laser irradiation, and hence, a state shown in FIG. 21A is obtained. In FIG. 21A, reference numeral 518 indicates one of the conductive films being electrically connected to the electrode 513.

As shown in FIG. 21A, holes are formed in the first substrate 500, the layer 504 including the circuits 503 having the thin film transistors, and the third insulating film 512 at positions irradiated with laser beams, and a material of the conductive films 517 is moved to the electrodes 513 along side walls of the holes; therefore, the conductive films 517 are electrically connected to the electrodes.

Note that an example where the output of the laser is adjusted such that the conductive films 517 are moved to reach the electrodes 513 and stopped at the electrodes 513, is shown here. Alternatively, the output of the laser may be adjusted such that holes passing through the fourth insulating film 514 and the second substrate 515 are formed.

Figure 21B:
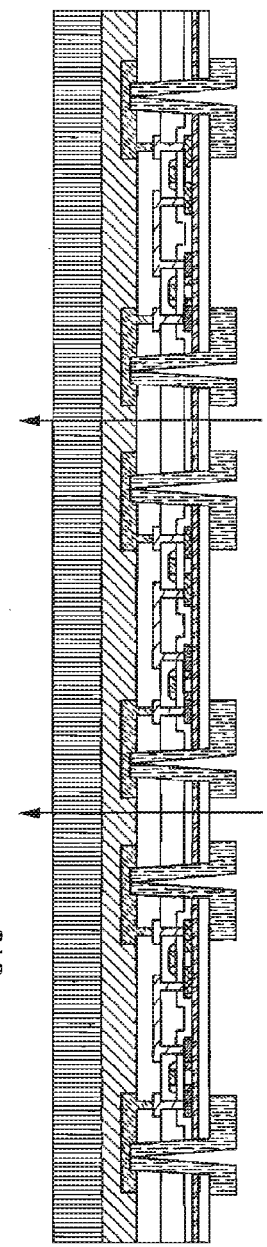
Figure 21C:
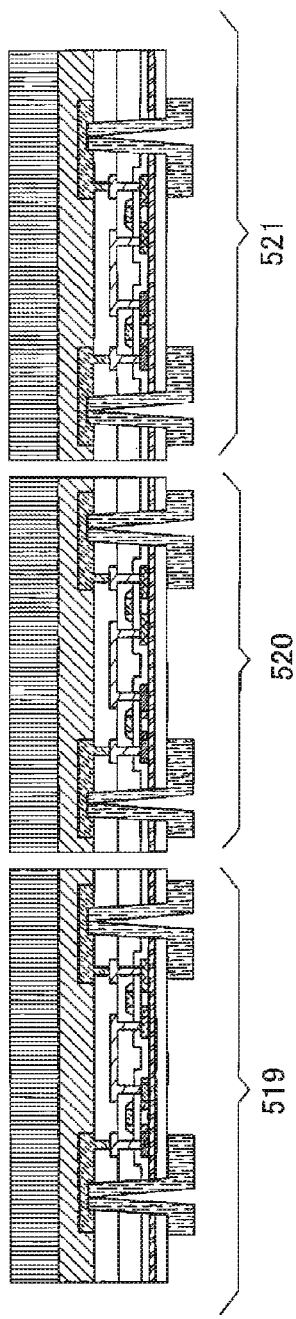

By irradiating each portion between the adjacent circuits 503 having the thin film transistors with laser beams as shown in FIG. 21B, the circuits 503 having the thin film transistors are individually divided into three portions 519, 520, and 521 each having the thin film transistors. The divided portions 519, 520, and 521 become integrated circuit devices, respectively.

A case where the three circuits 503 having the thin film transistors are formed over the substrate is described in this embodiment mode; however, the number of the circuits 503 having the thin film transistors provided over the substrate is not limited thereto. It goes without saying that the number of the circuit 503 having the thin film transistors may be one, two, or three or more.

As described above, integrated circuit devices of the present invention are formed. A step of forming a semiconductor device by mounting an integrated circuit device of the present invention obtained above over a substrate, over which an antenna is formed, will be described below.

As shown in FIG. 22A, a conductive film 523 having a function of an antenna is formed over a substrate 522. An integrated circuit device 526 is attached to a surface of the substrate 522 by using a resin 524 containing conductive particles 525. By attaching the integrated circuit device 526 and the substrate 522 using the resin 524 containing the conductive particles 525, connection portions of the conductive film 523 having the function of the antenna are electrically connected to connection conductive films provided adjacent to a back surface of the integrated circuit device 526 through the conductive particles 525.

Then, heat treatment is performed to cure the resin 524 containing the conductive particles 525. When the second substrate 515 is attached to the fourth insulating film 514 by using an adhesive material whose adhesion is weakened by heating, or when a heat separating film is used as the second substrate 515, the second substrate 515 can be separated from the fourth insulating film 514 by this heat treatment. A state after separating the second substrate 515 from the fourth insulating film 514 is shown in FIG. 22B.

As described above, the integrated circuit device of the present invention can be mounted over the substrate over which the antenna is formed. Note that a case where the conductive film having the function of the antenna and the integrated circuit device are electrically connected to each other by using the resin containing the conductive particles is described here. Alternatively, as a material for electrically connecting the conductive film having the function of the antenna to the integrated circuit device, a known material such as solder may be used, in addition to the resin containing the conductive particles.

In a case of using solder as a material for electrically connecting the conductive film having the function of the antenna to the integrated circuit device, heat treatment is also performed to melt the solder. Therefore, in a case where the second substrate 515 is attached to the fourth insulating film 514 by using an adhesive material whose adhesion is weakened by heating, or when a heat separating film is used as the second substrate 515, the second substrate 515 can be separated from the fourth insulating film 514 by this heat treatment.

Figure 23A:
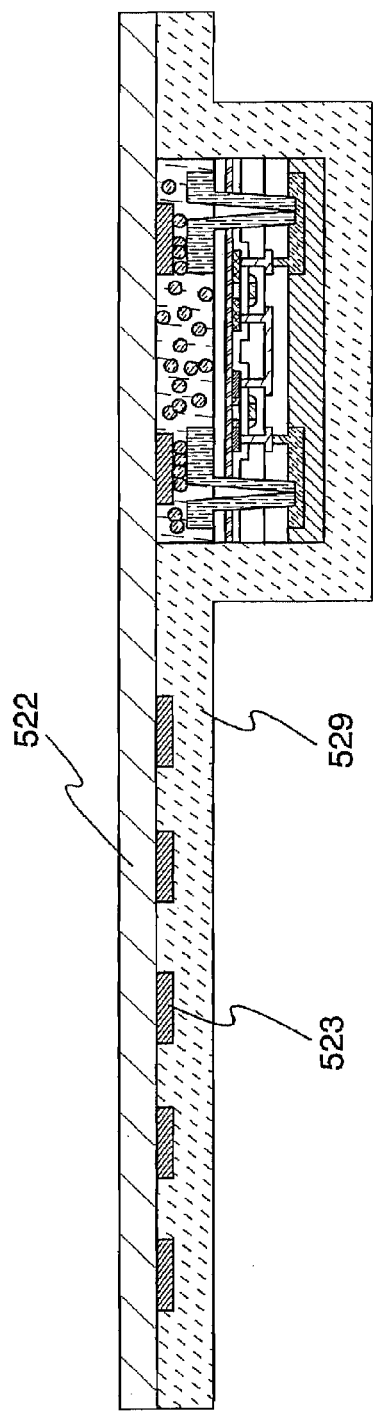
FIGS. 23A and 23B are cross sectional views explaining Embodiment Mode 5.

After mounting the integrated circuit device of the present invention over the substrate over which the antenna is formed, sealing is preferably performed. At least one surface of the substrate 522, over which the conductive film 523 having the function of the antenna is formed, may be sealed. A case where only one surface of the substrate 522, over which the conductive film 523 having the function of the antenna is formed, is sealed will be shown in FIG. 23A. When sealing is performed, the conductive film having the function of the antenna is sealed with a film 529 having a structure in which an adhesive layer is provided over a base film. As the film 529, a hot melt film can be given, for example. A hot melt film has a structure in which over a base film, an adhesive layer made from a resin having a softening point, which is lower than that of the base film, is formed. As a material used for the base film, polyester, PET (polyethylene terephthalate), PEN (polyethylene naphthalate), and the like can be given. A polyethylene resin, polyester, EVA (ethylene vinyl acetate), and the like can be given as a material used for the adhesive layer.

Figure 23B:
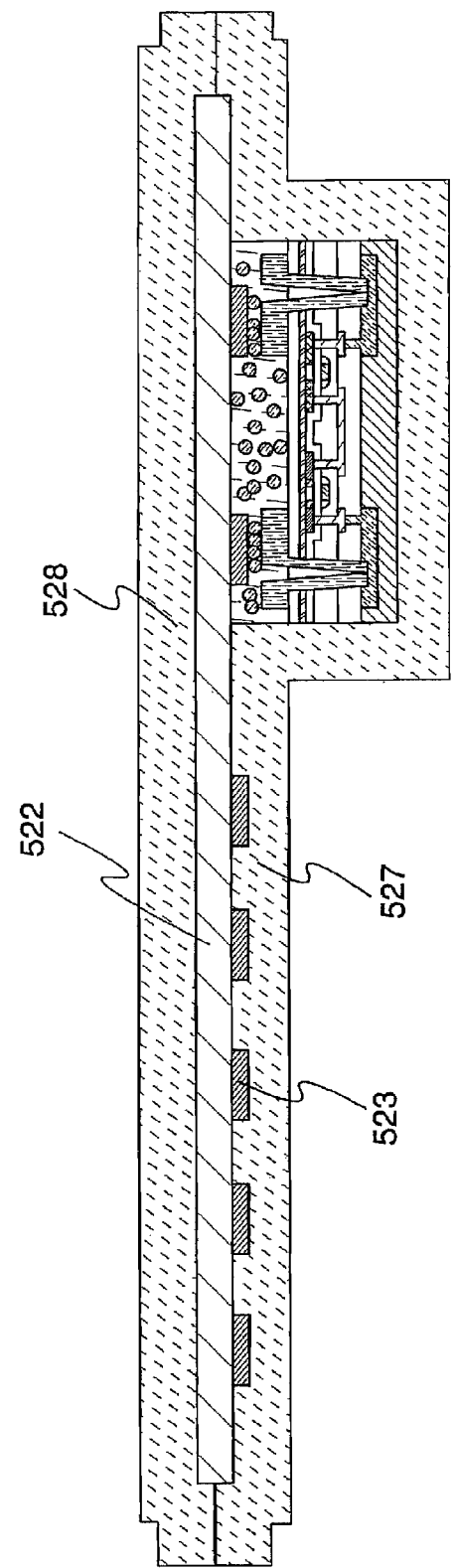

Further, as shown in FIG. 23B, the substrate 522 over which the antenna is formed may be sealed with two films 527 and 528. As the films 527 and 528 shown in FIG. 23B, films each having a structure having an adhesive layer formed over a base film may be used.

Although a case where the second substrate 515 is separated at the time of heat treatment and then the conductive film having the function of the antenna is sealed is described in FIGS. 22A and 22B and FIGS. 23A and 23B, the conductive film having the function of the antenna can be sealed while the second substrate 515 is attached to the surface of the fourth insulating film 514 without separating the second substrate 515. In this case, an adhesive agent used for attaching the second substrate 515 to the fourth insulating film 514 is not particularly limited, and an adhesive material whose adhesion is weakened by heating is not necessary to be used. Further, a film (such as a hot melt film) other than a heat separating film can be used as the second substrate.

Embodiment 1

In this embodiment, an example of mounting integrated circuit devices of the present invention over a substrate including a plurality of wirings will be described with reference to FIGS. 26A and 26B.

Figure 26A:
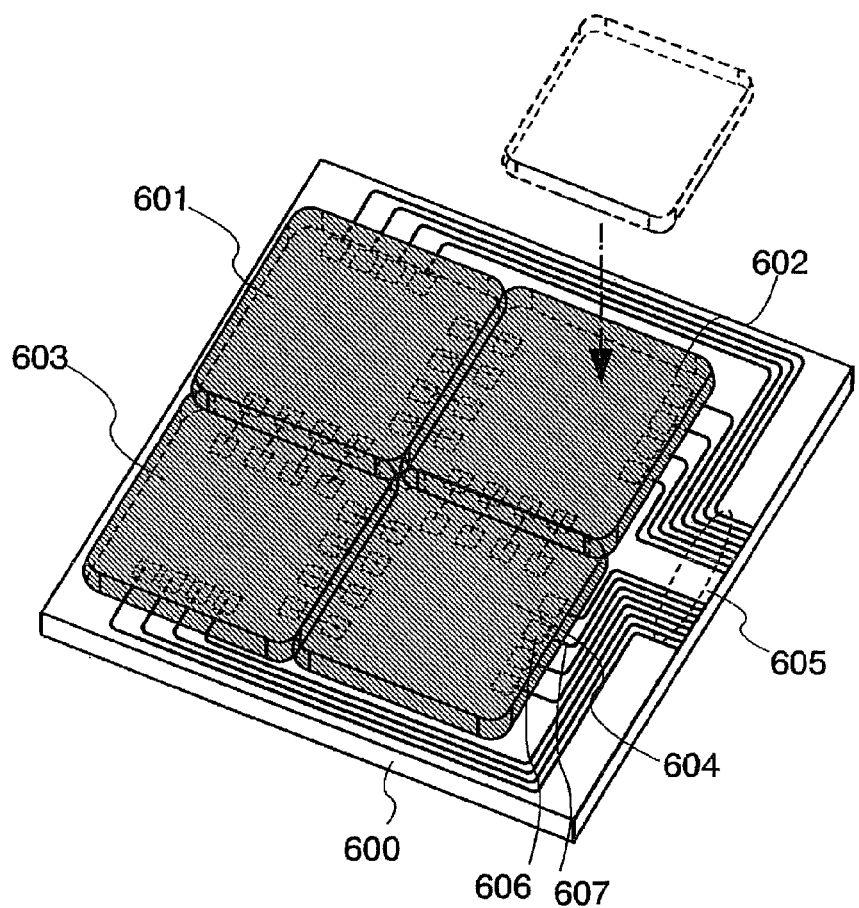
FIGS. 26A and 26B are diagrams explaining Embodiment 1.

In FIG. 26A, integrated circuit devices 601 to 604 of the present invention are attached to a surface of a substrate 600 having a plurality of wirings 605. In each of the integrated circuit devices 601 to 604, square portions surrounded by dashed lines are connection portions where thin film circuits and the wirings provided over the substrate 600 are connected.

Figure 26B:
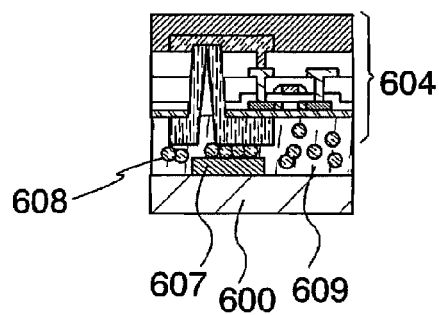

An enlarged view of a cross section of a single connection portion 606, which is one of the connection portions, is shown in FIG. 26B. As shown in FIG. 26B, a wiring 607 provided over the substrate 600 and a connection conductive film provided adjacent to a back surface of the integrated circuit device 604 are attached to each other by a resin 609 containing conductive particles 608. Since the connection conductive film provided adjacent to the back surface of the integrated circuit device is electrically connected to the circuit included in the integrated circuit device, a wiring provided over the substrate can be electrically connected to the circuit included in the integrated circuit device.

Further, the connection conductive films provided adjacent to the back surfaces of the integrated circuit devices 601 to 604 are attached to the wirings formed over the substrate with the resin 609 containing the conductive particles 608 in the same manner as the above described connection portion 606.

Each of the integrated circuit devices 601 to 604 serves as one or a plurality of a central processing unit (CPU), a memory, a network processing circuit, a disc processing circuit, an image processing circuit, an audio processing circuit, a power supply circuit, a temperature sensor, a humidity sensor, an infrared ray sensor, and the like.

Embodiment 2

Figure 27A:
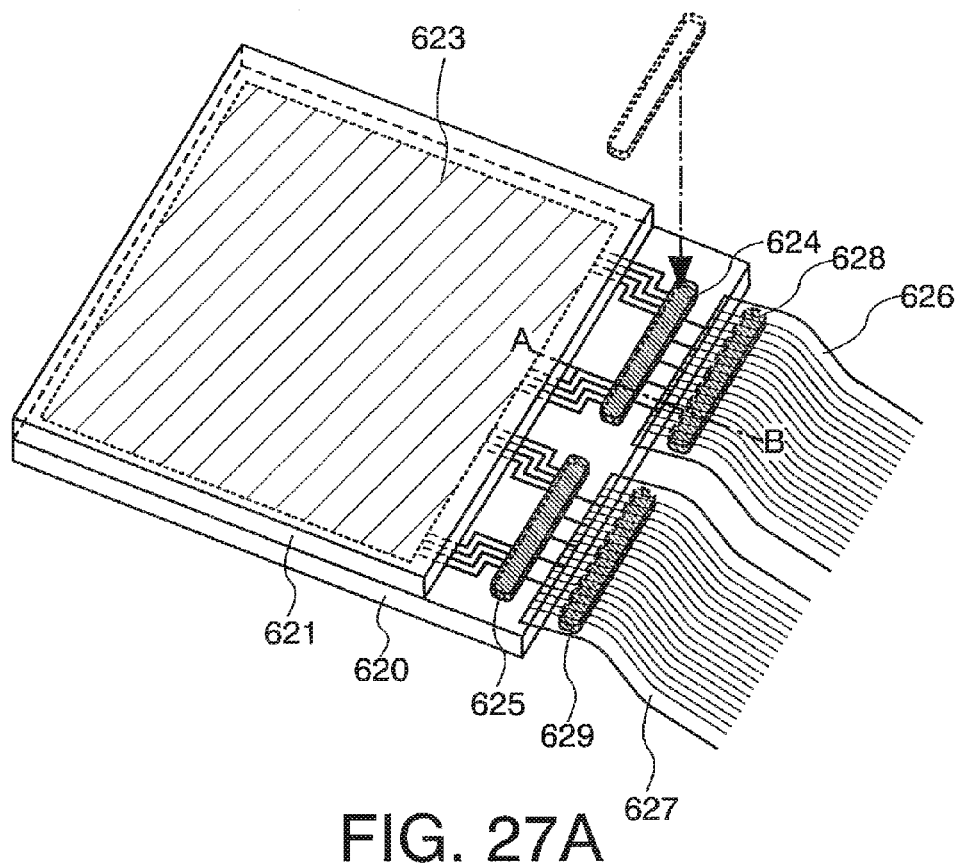
FIG. 27A is a top view and FIG. 27B is a cross sectional view explaining Embodiment 2.
Figure 27B:
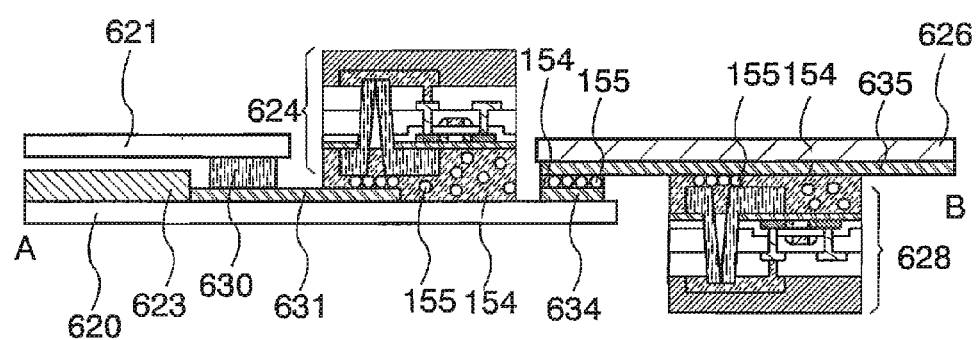

In this embodiment, an example in which integrated circuit devices of the present invention are applied to driver circuit portions of a display device, will be described with reference to FIGS. 27A and 27B. FIG. 27B shows a diagram showing a cross section along a line A-B of FIG. 27A. In FIG. 27A, a line A-B corresponds to the line A-B of FIG. 27B.

Integrated circuit devices 624 and 625 are attached to a surface of a substrate 620, and integrated circuit devices 628 and 629 are attached to surfaces of connection films 626 and 627. A display portion 623 and the integrated circuit 624 are connected to each other through conductive films 631 provided over the substrate 620. The integrated circuit device 624 and the integrated circuit device 628 are connected to each other through a conductive films 634 provided over the substrate 620 and a conductive film 635 provided over the connection film 627. These conductive films are connected by using a resin 154 containing conductive particles 155. The substrate 620 and a counter substrate 621 are attached to each other with a seal material 630.

Although an example of a case of mounting the integrated circuit devices of the present invention over the substrate 620 and the connection films 626 and 627 respectively, is shown in this embodiment, the present invention is not limited thereto. Integrated circuit devices of the present invention may be mounted only over the substrate 620 as driver circuits, or only over the connection films.

Since an integrated circuit device of the present invention has flexibility, it is suitable to be formed over a connection film. When the integrated circuit device of the present invention is attached to a curved connection film, the integrated circuit device of the present invention can also be curved.

Further, a known substrate material such as a glass substrate, a semiconductor substrate, a quartz substrate, or a resin substrate can be used as the substrate 620. In particular, when using a flexible substrate, since an integrated circuit device of the present invention has also flexibility, the integrated circuit device can be curved along with the substrate. As the flexible substrate, a resin substrate; a glass substrate or a semiconductor substrate whose thickness is reduced by grinding, polishing, or the like; and the like can be given.

Embodiment 3

In this embodiment, an IC card including an integrated circuit device of the present invention will be described with reference to FIGS. 28A to 28C.

As shown in FIG. 28A, a conductive film 642 having a function of an antenna is formed over a card-type substrate 640. An integrated circuit device 641 of the present invention is attached to a surface of the card-type substrate 640. The integrated circuit device 641 and the conductive film 642 having the function of the antenna are electrically connected to each other. An enlarged view of a cross section at a connection portion 643 between the integrated circuit device 641 and the conductive film 642 having the function of the antenna is shown in FIG. 28B.

As shown in FIG. 28B, the conductive film 642 having the function of the antenna provided over the card-type substrate 640 and a connection conductive film provided adjacent to a back surface of the integrated circuit device 641 are attached to each other by a resin 645 containing conductive particles 644. The connection conductive film provided adjacent to the back surface of the integrated circuit device is electrically connected to a circuit included in the integrated circuit device, and therefore, the conductive film 642 having the function of the antenna provided over the card-type substrate 640 and the circuit included in the integrated circuit device 641 are electrically connected to each other.

As the card-type substrate 640, a flexible substrate (for example, a plastic substrate) is used. Moreover, since the integrated circuit device of the present invention has flexibility, when it is mounted over a flexible substrate, the integrated circuit device can be curved together with the card-type substrate 640 as shown in FIG. 28C.

Embodiment 4

An example of an IC card having integrated circuit devices of the present invention, which is different from that of Embodiment 3, will be described with reference to FIGS. 29A to 29D.

As shown in FIG. 29A, a conductive film 661 having a function of an antenna is formed over a card-type substrate 660. Integrated circuit devices 662 to 665 of the present invention are attached to a surface of the card-type substrate 660. The integrated circuit device 664 and the conductive film 661 having the function of the antenna are electrically connected to each other. An enlarged view of a cross section at a connection portion 666 between the integrated circuit device 664 and the conductive film 661 having the function of the antenna is shown in FIG. 29B.

As shown in FIG. 29B, the conductive film 661 having the function of the antenna provided over the card-type substrate 660 and a connection conductive film provided adjacent to a back surface of the integrated circuit device 664 are attached to each other with a resin 668 containing conductive particles 667. The connection conductive film provided adjacent to the back surface of the integrated circuit device 664 is electrically connected to a circuit included in the integrated circuit device 664, and therefore, the conductive film 661 having the function of the antenna provided over the card-type substrate 660 and the circuit included in the integrated circuit device 664 can be electrically connected to each other.

Each of the integrated circuit devices 662 to 665 serves as one or a plurality of a central processing unit (CPU), a memory, a network processing circuit, a disc processing circuit, an image processing circuit, an audio processing circuit, a power supply circuit, a temperature sensor, a humidity sensor, an infrared ray sensor, and the like.

The IC card of this embodiment has the integrated circuit device 664 including the structure described above and the integrated circuit devices 662, 663, and 665. Therefore, a high-performance IC card capable of performing complicated processing such as encryption processing can be provided.

Although how to electrically connect the integrated circuit devices 662 to 665 is not particularly described in FIG. 29A, the adjacent integrated circuit devices are electrically connected to one another.

The conductive film 661 having the function of the antenna is provided around the integrated circuit devices 662 to 665 in the structure shown in FIG. 29A; however, the present invention is not limited to this mode. As shown in FIG. 29C and FIG. 29D, the integrated circuit devices 662 to 665 may be provided to overlap with the conductive film 661 having the function of the antenna. Providing the integrated circuit devices 662 to 665 to overlap with the conductive film 661 having the function of the antenna makes it possible to reduce an area of the card-type substrate 660 as compared to the case of FIG. 29A, thereby providing a small, thin, and lightweight semiconductor device. For example, in a case where a temperature sensor is applied to any one of the integrated circuit devices 662 to 665 of a miniaturized wireless chip and the wireless chip is attached to human skin (preferably, skin of one's forehead), measurement of body temperature can be carried out.

Embodiment 5

Figure 30A:
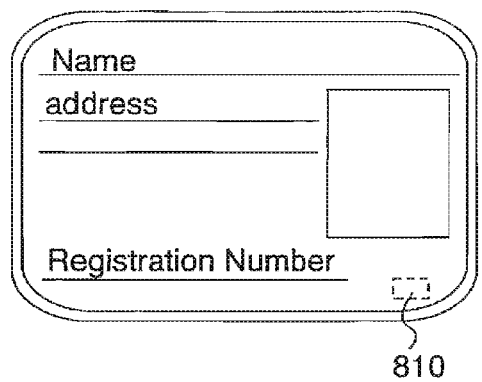
FIGS. 30A to 30E are diagrams explaining Embodiment 5.
Figure 30B:
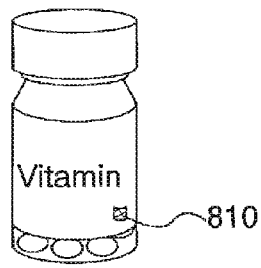
Figure 30C:
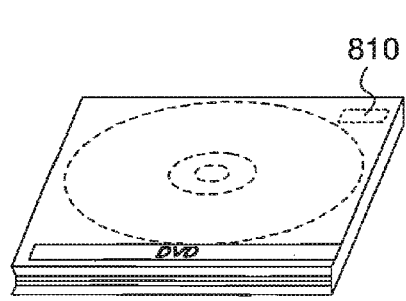
Figure 30D:
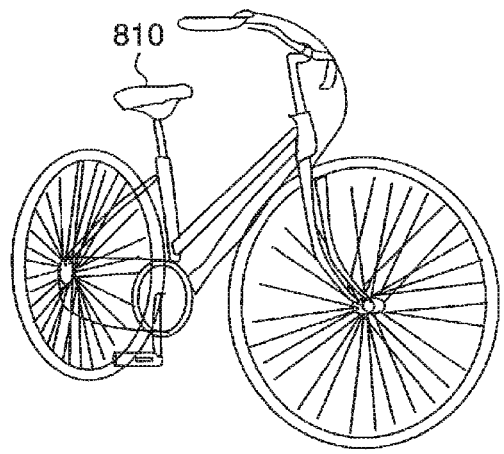
Figure 30E:

A semiconductor device of the present invention having an integrated circuit device and an antenna is applicable to various fields. Specific application examples will be described below. Semiconductor devices 810 of the present invention can be utilized to be provided over articles such as paper notes; coins; securities; bearer stock certificates; certificates (e.g., a driver's license, a resident card and the like, see FIG. 30A); packing containers (e.g., a wrapping paper, a plastic bottle and the like, see FIG. 30B); recording mediums (e.g., DVD software, a videotape and the like, see FIG. 30C); vehicles (e.g., a bicycle and the like, see FIG. 30D); personal belongings (e.g., a bag, eyeglasses and the like, see FIG. 30E); food items; clothes; livingware; and electronic appliances. The electronic appliances indicate a liquid crystal display device, an EL display device, a television device (also, simply referred to as a television or a television receiver), a portable phone, and the like.

A single semiconductor device 810 of the present invention including an integrated circuit device and an antenna is fixed to an article by being attached to a surface of the article or embedded in the article. For example, the semiconductor device 810 is embedded in a paper of a book, or embedded in an organic resin of a package that is formed using the organic resin. Since the semiconductor device 810 of the present invention is small, thin, and lightweight, after fixing it to an article, design of the article is not impaired by the semiconductor device. By providing the semiconductor devices of the present invention to bills, coins, portfolios, bearer stock certificates, certificates, and the like, identification functions can be provided to these things. By utilizing the identification functions, forgery of these things can be prevented. In addition, by providing the semiconductor devices to wrapping containers, recording mediums, personal belongings, food items, clothes, livingware, electronic appliances and the like, a system such as an inspection system can be improved efficiently.

Figure 31A:
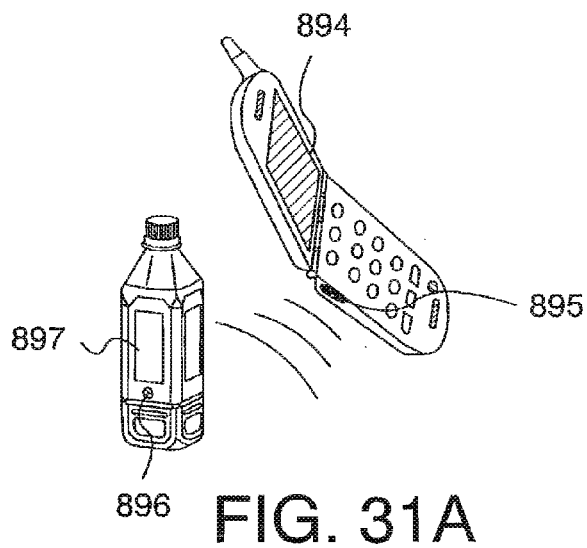
FIGS. 31A and 31B are diagrams explaining Embodiment 5.
Figure 31B:
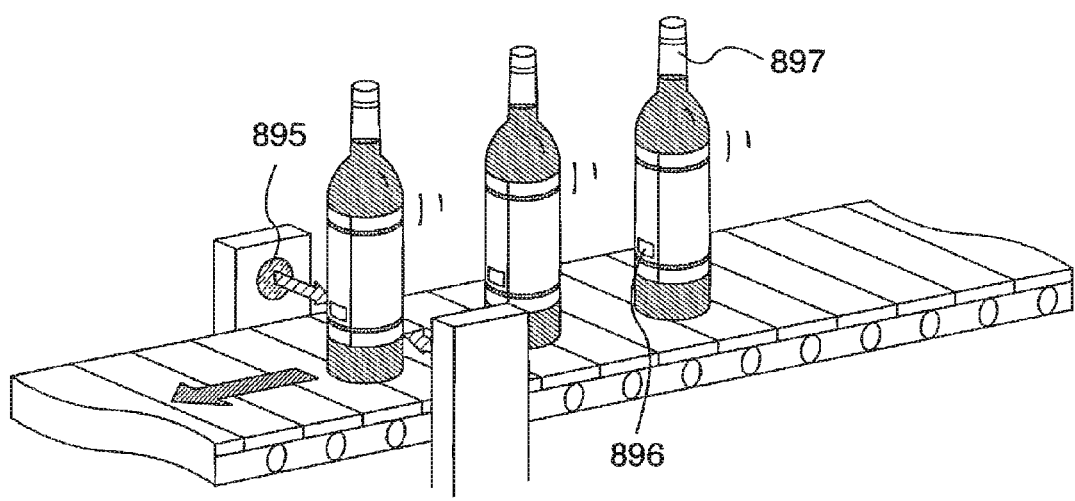

Next, an example of a system utilizing a semiconductor device of the present invention will be described. A reader/writer 895 is provided on a side surface of a portable terminal including a display portion 894, and a semiconductor device 896 of the present invention including an integrated circuit device and an antenna is provided on a side surface of an article 897 (see FIG. 31A). Further, information relating to the article 897, such as a raw material, a place of origin of the article, and a test result per production process, is stored in the semiconductor device 896 including the integrated circuit device of the present invention and the antenna in advance. When information stored in the semiconductor device 896 of the present invention including the integrated circuit device and the antenna is displayed on the display portion 894 with a time the semiconductor device 896 of the present invention including the integrated circuit device and the antenna is held up against the reader/writer 895, a convenient system can be provided. As other example, the reader/writer 895 is provided on the side of a belt conveyor (see FIG. 31B). This can provide a system by which the article 897 can be inspected very easily. As set forth above, by utilizing a semiconductor device of the present invention to a management system or a distribution system of articles, performance of the system can be improved, making it possible to improve convenience.

The present application is based on Japanese Patent Application serial No. 2005-161413 filed on Jun. 1, 2005 in Japanese Patent Office, the entire contents of which are hereby incorporated by reference.

What is claimed is:

1. A device comprising:
a first conductive film over a substrate;
a second conductive film over and electrically connected to the first conductive film;
a transistor including a gate insulating film, an interlayer insulating film, a source electrode and a drain electrode over the substrate; and
an electrode connected to one of the source electrode and the drain electrode and electrically connected to the second conductive film over the transistor,
wherein at least a part of the second conductive film is provided in a contact hole formed in the gate insulating film and the interlayer insulating film, and
wherein the second conductive film comprises copper.

2. The device according to claim 1, wherein the transistor is a thin film transistor.

3. The device according to claim 1, wherein the first conductive film is electrically connected to the second conductive film through conductive particles in a resin.

4. An electric appliance including the device according to claim 1.

5. The electric appliance according to claim 4, wherein the electric appliance is one of a liquid crystal display device, an EL display device, a television device, and a portable phone.

6. A device comprising:
a first conductive film over a substrate;
a second conductive film over and electrically connected to the first conductive film;
a transistor including a gate insulating film, an interlayer insulating film, a source electrode and a drain electrode over the substrate; and
an electrode connected to one of the source electrode and the drain electrode and electrically connected to the first conductive film through the second conductive film over the transistor,
wherein at least a part of the second conductive film is provided in a contact hole formed in the gate insulating film and the interlayer insulating film, and
wherein the second conductive film comprises copper.

7. The device according to claim 6, wherein the transistor is a thin film transistor.

8. The device according to claim 6, wherein the first conductive film is electrically connected to the second conductive film through conductive particles in a resin.

9. An electric appliance including the device according to claim 6.

10. The electric appliance according to claim 9, wherein the electric appliance is one of a liquid crystal display device, an EL display device, a television device, and a portable phone.

11. A device comprising:
a first conductive film over a substrate;
a second conductive film over and electrically connected to the first conductive film;
an insulating film over a part of the second conductive film;
a transistor including a gate insulating film, an interlayer insulating film, a source electrode and a drain electrode over the substrate; and
an electrode connected to one of the source electrode and the drain electrode and electrically connected to the second conductive film over the transistor,
wherein at least a part of the second conductive film is provided in a contact hole formed in the gate insulating film, the interlayer insulating film, and the insulating film, and
wherein the second conductive film comprises copper.

12. The device according to claim 11, wherein the transistor is a thin film transistor.

13. The device according to claim 11, wherein the first conductive film is electrically connected to the second conductive film through conductive particles in a resin.

14. An electric appliance including the device according to claim 11.

15. The electric appliance according to claim 14, wherein the electric appliance is one of a liquid crystal display device, an EL display device, a television device, and a portable phone.

16. A device comprising:
a first conductive film over a substrate;
a second conductive film over and electrically connected to the first conductive film;
an insulating film over a part of the second conductive film;
a transistor including a gate insulating film, an interlayer insulating film, a source electrode and a drain electrode over the substrate; and
an electrode connected to one of the source electrode and the drain electrode and electrically connected to the first conductive film through the second conductive film over the transistor,
wherein at least a part of the second conductive film is provided in a contact hole formed in the gate insulating film, the interlayer insulating film, and the insulating film, and
wherein the second conductive film comprises copper.

17. The device according to claim 16, wherein the transistor is a thin film transistor.

18. The device according to claim 16, wherein the first conductive film is electrically connected to the second conductive film through conductive particles in a resin.

19. An electric appliance including the device according to claim 16.

20. The electric appliance according to claim 19, wherein the electric appliance is one of a liquid crystal display device, an EL display device, a television device, and a portable phone.

* * * * *